United States Patent
Kim

(10) Patent No.: US 9,998,151 B2
(45) Date of Patent: Jun. 12, 2018

(54) DATA STORAGE DEVICE AND OPERATING METHOD THEREOF

(71) Applicant: SK hynix Inc., Gyeonggi-do (KR)

(72) Inventor: Do Hun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/184,438

(22) Filed: Jun. 16, 2016

(65) Prior Publication Data

US 2017/0187397 A1    Jun. 29, 2017

(30) Foreign Application Priority Data

Dec. 24, 2015 (KR) .................. 10-2015-0186488

(51) Int. Cl.
| | |
|---|---|
| *H03M 13/29* | (2006.01) |
| *G11C 29/52* | (2006.01) |
| *G06F 11/10* | (2006.01) |
| *H03M 13/37* | (2006.01) |
| *G11C 29/04* | (2006.01) |

(52) U.S. Cl.
CPC ..... *H03M 13/2948* (2013.01); *G06F 11/1048* (2013.01); *G06F 11/1068* (2013.01); *H03M 13/3707* (2013.01); *H03M 13/3746* (2013.01); *G11C 29/52* (2013.01); *G11C 2029/0411* (2013.01)

(58) Field of Classification Search
CPC . H03M 13/2948; G06F 11/1068; G11C 29/52
See application file for complete search history.

(56) References Cited

U.S. PATENT DOCUMENTS

| | | | |
|---|---|---|---|
| 2010/0037121 A1* | 2/2010 | Jin | H03M 13/1117 714/763 |
| 2010/0100797 A1 | 4/2010 | Chen | |
| 2012/0054576 A1* | 3/2012 | Gross | H03M 13/1117 714/752 |
| 2014/0082455 A1* | 3/2014 | Yosoku | G06F 11/10 714/763 |
| 2014/0105272 A1* | 4/2014 | Bulusu | H04N 19/13 375/240.02 |
| 2016/0233883 A1* | 8/2016 | Sedighi | H03M 13/112 |
| 2016/0233884 A1* | 8/2016 | Sedighi | H03M 13/112 |

* cited by examiner

*Primary Examiner* — Kyle Vallecillo
(74) *Attorney, Agent, or Firm* — IP & T Group LLP

(57) ABSTRACT

A method for operating a data storage device including a nonvolatile memory device and first and second type decoders includes: obtaining a plurality entry values of total power consumption value of the first and second type decoders respectively based on a plurality entry values of decoding performance information of the first type decoders; choosing a minimum value among the plurality entry values of total power consumption value; generating first and second decoding control information according to the minimum value in order to control the first and second type decoders; updating the decoding performance information at each of the decoding operations of the first and second type decoders; and repeating the obtaining of the total power consumption value, the choosing of the minimum value, and the generating of the first and second decoding control information based on the updated decoding performance information.

20 Claims, 15 Drawing Sheets

LUT

|  | First Type Decoder | | Second Type Decoder |
|---|---|---|---|
|  | ITR1 | FR | ITR2 |
| PE100/R0Y | 5 | 7.00% | 10 |
| | 6 | 3.00% | |
| | 7 | 1.00% | |
| | 8 | 0.50% | |
| | 9 | 0.40% | |
| | 10 | 0.30% | |
| PE200/R1Y | 5 | 22.00% | |
| | 6 | 8.00% | |
| | 7 | 3.30% | |
| | 8 | 1.60% | |
| | 9 | 1.50% | |
| | 10 | 1.30% | |

FIG. 10

| | | First Type Decoder | | | | Second Type Decoder | | | |
|---|---|---|---|---|---|---|---|---|---|
| | PR | TH1=TT*(100-PR) (TT=1000) | CLK1=TT*TR1/i (i=16) | PWR1=CLK1*TR1/p (p=1) | ITK2 | TH2=TT-TH1 | CLK2=TH2*TR2/j (j=8) | PWR2=CLK2*TR2/n (n=1) | TPWR= PWR1+PWR2 |
| PR1=0.5%,p=2 | 5 | 7.00% | 93 | 31.25 | 31.25 | 10 | 7 | 8.75 | 35 | 66.25 |
| | 6 | 3.00% | 97 | 37.5 | 37.5 | | 3 | 3.75 | 15 | 52.5 |
| | 7 | 1.00% | 99 | 43.75 | 43.75 | | 1 | 1.25 | 5 | 48.75 |
| | 8 | 0.50% | 99.5 | 31.25 | 31.25 | | 0.5 | 0.625 | 2.5 | 52.5 |
| | 9 | 0.40% | 99.6 | 50 | 50 | | 0.4 | 0.5 | 2 | 58.25 |
| | 10 | 0.30% | 99.7 | 56.25 | 56.25 | | 0.3 | 0.375 | 1.5 | 64 |
| PR2=22.0%,p=1 | 5 | 22.00% | 78 | 62.5 | 62.5 | | 22 | 27.5 | 110 | 140.25 |
| | 6 | 8.00% | 92 | 31.25 | 31.25 | | 8 | 10 | 40 | 71.5 |
| | 7 | 3.30% | 96.7 | 37.5 | 37.5 | | 3.3 | 4.125 | 16.5 | 66.25 |
| | 8 | 1.60% | 98.4 | 50 | 50 | | 1.6 | 2 | 8 | 58 |
| | 9 | 1.50% | 98.5 | 56.25 | 56.25 | | 1.5 | 1.875 | 7.5 | 63.75 |
| | 10 | 1.30% | 98.7 | 62.5 | 62.5 | | 1.3 | 1.625 | 6.5 | 69 |

LUT

FIG. 11

DATA STORAGE DEVICE AND OPERATING METHOD THEREOF

CROSS-REFERENCES TO RELATED APPLICATION

The present application claims priority under 35 U.S.C. § 119(a) to Korean application number 10-2015-0186488, filed on Dec. 24, 2015, in the Korean Intellectual Property Office, which is incorporated herein by reference in its entirety.

BACKGROUND

1. Technical Field

Various embodiments generally relate to a data storage technology and more particularly, to a data storage device capable of efficiently performing an ECC decoding operation and an operating method thereof.

2. Related Art

Recently, the paradigm for the computer environment has shifted to ubiquitous computing systems that can be used anywhere and at any time. Due to this, use of portable electronic devices, such as mobile phones, digital cameras, and notebook computers has rapidly increased. Generally, these portable electronic devices use a data storage device including a memory device for storing data.

Data storage device using memory devices provide excellent stability, durability, high information access speed and low power consumption, because they have no moving parts. Examples, of data storage devices having such advantages include universal serial bus (USB) memory devices, memory cards having various interfaces, and solid state drives (SSD).

Portable electronic devices that are capable to play large files, such as music or video files, require data storage devices having large storage capacities. Data storage devices use, as a storage medium, memory devices having a high integration degree for memory cells for obtaining large storage capacities. An example, of a well-known, large capacity memory device is a flash memory device which is a nonvolatile memory device.

Memory devices often include an error correction code (ECC) for correcting erroneous data read from a memory device. As demand for higher capacity, higher integration memory devices continues to increase a need for improved ECC s and related ECC decoding methods has also increased.

SUMMARY

Various embodiments of the present invention are directed to a data storage device capable of more efficiently performing an ECC decoding operation and an operating method thereof.

In an embodiment, a data storage device may include: a nonvolatile memory device; and an error correction code (ECC) unit including a first decoding group having first type decoders, a second decoding group having second type decoders, and a decoding control block which controls decoding operations of the first decoder group and the second decoder group for data read out from the nonvolatile memory device, wherein the decoding control block generates an iteration count and a dock of a first type decoder corresponding to a minimum value among total power consumption amounts obtained by summing power consumption amounts of the first decoder group and power consumption amounts of the second decoder group calculated for respective decoding fail rates based on a reference information including a state information of a memory region of the nonvolatile memory device in which the read-out data is stored, a characteristic information of the first type decoders and a characteristic information of the second type decoders, as a first decoding control information, and generates an iteration count and a clock of a second type decoder as a second decoding control information.

In an embodiment, a method for operating data storage device: defining a first decoding fail rate of a first type decoder corresponding to a first iteration count, a second decoding fail rate of the first type decoder corresponding to a second iteration count, and an iteration count of a saturation state in which performance of a second type decoder is a maximum; calculating a first total power consumption amount by summing a first power consumption amount consumed to retain a first throughput of the first type decoder calculated based on a target throughput and the first decoding fail rate, and a second power consumption amount consumed to retain a first throughput of the second type decoder as a difference between the target throughput and the first throughput of the first type decoder; calculating a second total power consumption amount by summing a third power consumption amount consumed to retain a second throughput of the first type decoder calculated based on the target throughput and the second decoding fail rate, and a fourth power consumption amount consumed to retain a second throughput of the second type decoder as a difference between the target throughput and the second throughput of the first type decoder; and providing the first iteration count corresponding to the first total power consumption amount as a first decoding control information for controlling the first type decoder, and providing the iteration count of the saturation state as a second decoding control information for controlling the second type decoder, in the case where it is determined that the first total power consumption amount is smaller than the second total power consumption amount.

In an embodiment, a data storage device may include: a nonvolatile memory device; one or more first type decoders each suitable for performing a decoding operation to data read out from the nonvolatile memory device; one or more second type decoders each suitable for performing a decoding operation to data, to which the decoding operations of one or more of the first type decoders fail; and a decoding control block suitable for: obtaining a plurality entry values of total power consumption amount of the first and second type decoders respectively based on a plurality entry values of decoding performance information (e.g., a decoding fail rate) of the first type decoders; choosing a minimum value among the plurality entry values of total power consumption amount; generating first and second decoding control information according to the minimum value in order to control the first and second type decoders; updating the decoding performance information at each of the decoding operations of the first and second type decoders; and repeating the obtaining of the total power consumption amount, the choosing of the minimum value, and the generating of the first and second decoding control information based on the updated decoding performance information.

Each of the first and second type decoders may perform the decoding operation iteratively, and the plurality of entry values of the decoding performance information may respectively correspond to a plurality of entry values of iteration count information of one or more of the first and second type decoders.

The plurality of entry values of the decoding performance information may respectively correspond to the plurality of entry values of the iteration count information of one of the first type decoders, and the iteration count information of the second decoding group may include an entry value of entering a saturation state of one of the second type decoders and may correspond to the plurality of entry values of the iteration count information of one of the first type decoders.

The total power consumption amount may be sum of power consumption of the first and second type decoders, and the decoding control block may obtain each of the power consumption of the first and second type decoders based on the plurality entry values of decoding performance information.

The decoding control block may further receive from the first and second type decoders results of the decoding operations performed according to the first and second decoding control information.

The decoding control block may update the decoding performance information based on the result of the decoding operation of the first type decoders.

The results of the decoding operations may include: a decoding pass/fail information indicating whether the decoding operations have succeeded or failed, an iterative performance count information indicating counts by which the decoding operations are iterated, and an error count information indicating counts of errors included in decoded data.

The decoding control block may obtain a plurality of entry values of the total power consumption amount based on at least a part of the entry values of the decoding performance information.

The first decoding control information may include one of the plurality of entry values of the iteration count information of one of the first type decoders corresponding to the minimum value, and wherein the second decoding control information includes the entry value of entering the saturation state of one of the second type decoders.

In an embodiment, a method for operating a data storage device including a nonvolatile memory device and first and second type decoders may include: obtaining a plurality entry values of total power consumption amount of the first and second type decoders respectively based on a plurality entry values of decoding performance information (e.g., a decoding fail rate) of the first type decoders; choosing a minimum value among the plurality entry values of total power consumption amount; generating first and second decoding control information according to the minimum value in order to control the first and second type decoders; updating the decoding performance information at each of the decoding operations of the first and second type decoders; and repeating the obtaining of the total power consumption amount, the choosing of the minimum value, and the generating of the first and second decoding control information based on the updated decoding performance information.

Each of one or more first type decoders may iteratively perform a decoding operation to data read out from the nonvolatile memory device, each of one or more second type decoders may iteratively perform a decoding operation to data, to which the decoding operations of one or more of the first type decoders fail, and the plurality of entry values of the decoding performance information may respectively correspond to a plurality of entry values of iteration count information of one or more of the first and second type decoders.

The plurality of entry values of the decoding performance information may respectively correspond to the plurality of entry values of the iteration count information of one of the first type decoders, and the iteration count information of the second decoding group may include an entry value of entering a saturation state of one of the second type decoders and may corresponds to the plurality of entry values of the iteration count information of one of the first type decoders.

The total power consumption amount may be sum of power consumption of the first and second type decoders, and the obtaining of the total power consumption amount may be performed by obtaining each of the power consumption of the first and second type decoders based on the plurality entry values of decoding performance information.

The method may further include receiving from the first and second type decoders results of the decoding operations performed according to the first and second decoding control information.

The updating of the decoding performance information may be performed on the basis of the result of the decoding operation of the first type decoders.

The results of the decoding operations may include: a decoding pass/fail information indicating whether the decoding operations have succeeded or failed, an iterative performance count information indicating counts by which the decoding operations are iterated, and an error count information indicating counts of errors included in decoded data.

The obtaining of the plurality entry values of total power consumption amount may be performed on the basis of at least a part of the entry values of the decoding performance information.

The first decoding control information includes one of the plurality of entry values of the iteration count information of one of the first type decoders corresponding to the minimum value, and the second decoding control information may include the entry value of entering the saturation state of one of the second type decoders.

According to embodiments of the invention, power consumption for an ECC decoding operation may be optimized without compromising the speed of the ECC decoding operation.

BRIEF DESCRIPTION OF THE DRAWINGS

FIGS. 10 and 11 are tables illustrating processes for a decoding control block to generate a first and a second decoding control information.

DETAILED DESCRIPTION

Figure 1:
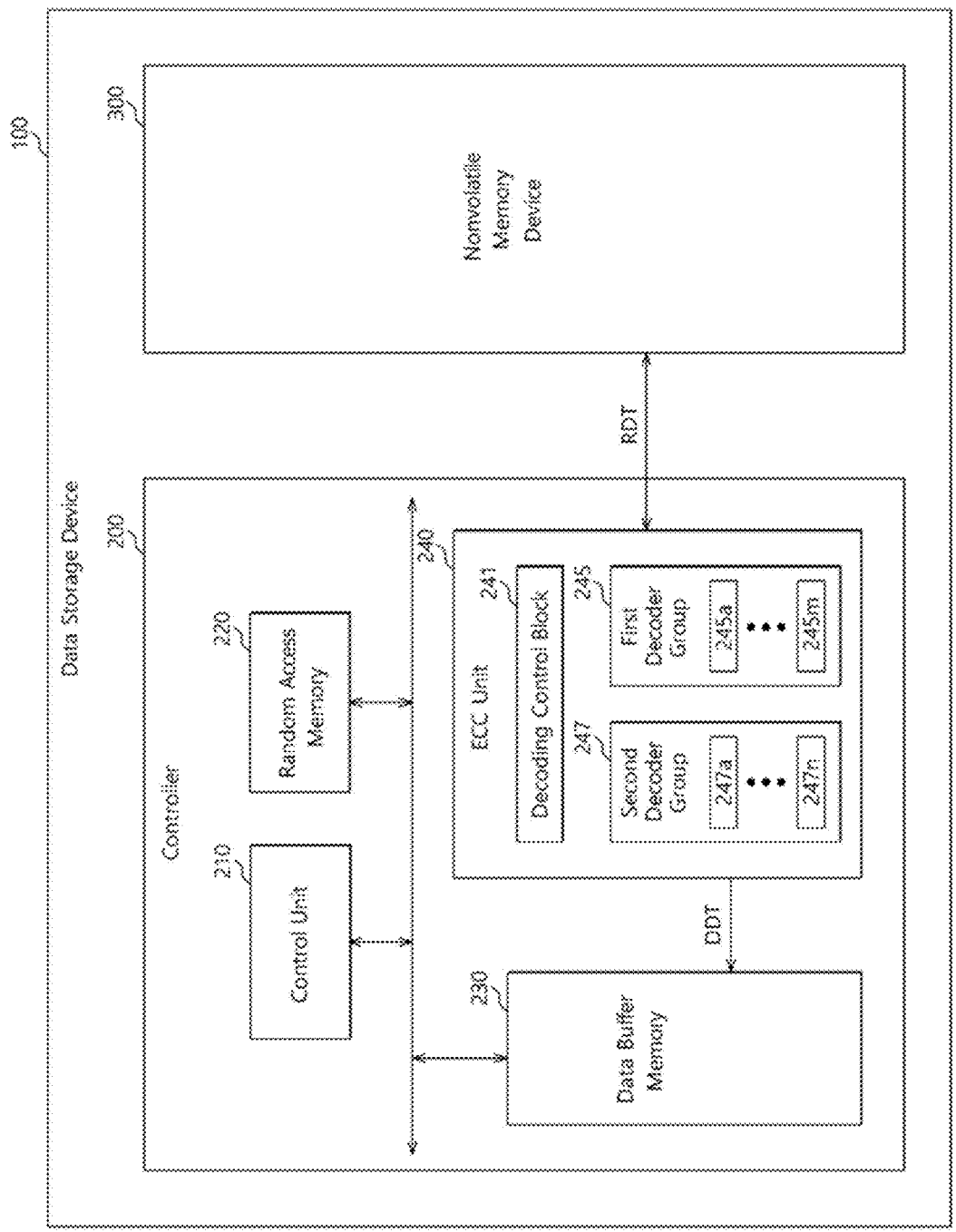
FIG. 1 is a block diagram illustrating a data storage device including an error correction unit, according to an embodiment of the invention.

In the present invention, advantages, features and related methods will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in sufficient detail to enable a person skilled in the art to which the invention pertains to practice the present invention.

It is to be understood herein that embodiments of the present invention are not limited to the particulars shown in the drawings, that the drawings are not necessarily to scale and in some instances proportions may have been exaggerated in order to more clearly depict certain features of the invention. While particular terminology is used herein, it is to be appreciated that the used terminology is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element, or intervening elements may be present. As used herein, a singular form is intended to include plural forms as well, unless the context clearly indicates otherwise. It will be further understood that the terms "includes," "including," "comprises," and or "comprising" when used in this specification, specify the presence of at least one stated feature, step, operation, and/or element, but do not preclude the presence or addition of one or more other non-stated features, steps, operations, and/or elements thereof.

Hereinafter, various embodiments of the invention including a data storage device and an operating method thereof will be described below with reference to the accompanying drawings.

FIG. 1 is a block diagram illustrating a data storage device 100 according to an embodiment of the invention.

A data storage device 100 may store data to be accessed by a host device (not shown). The host device may be a mobile phone, an MP3 player, a laptop computer, a desktop computer, a game player, a TV, an in-vehicle infotainment system, and the like. The data storage device 100 may also be referred to as a memory system.

The data storage device 100 may be manufactured as any one of various kinds of storage devices according to the protocol of an interface which may electrically coupled with the host device. For example, the data storage device 100 may be configured as any one of various kinds of storage devices, such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and the like.

The data storage device 100 may be manufactured as any one of various kinds of package types. For example, the data storage device 100 may be manufactured as any one of various kinds of package types, such as a package-on-package (POP), a system-in-package (SIP), a system-on-chip (SOC), a multi-chip package (MCP), a chip-on-board (COB), a wafer-level fabricated package (WFP), a wafer-level, stack package (WSP) and the like.

The data storage device 100 may include a nonvolatile memory device 300. The nonvolatile memory device 300 may operate as the storage medium of the data storage device 100. The nonvolatile memory device 300 may be configured by any one of various types of nonvolatile memory devices, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, a resistive random access memory (RERAM) using a transition metal oxide, and the like.

The data storage device 100 may include a controller 200. The controller 200 may be coupled with the nonvolatile memory device 300 through a channel. Any suitable channel may be used. For example, the channel may include signal lines for the controller 200 to transmit control signals (for example, a chip select signal, a command, an address, and the like) for controlling the nonvolatile memory device 300. Also, for example, the channel may include signal lines for transmitting data between the controller 200 and the nonvolatile memory device 300.

The controller 200 may include a control unit 210, a random access memory 220, a data buffer memory 230, and an error correction code (ECC) unit 240.

The control unit 210 may control the general operations of the controller 200. The control unit 210 may analyze and process a signal, a command or a request received from the host device. For example, the control unit 210 may decode and drive a firmware or a software loaded on the random access memory 220. The control unit 210 may be realized in the form of hardware. The control unit 210 may be realized in a combined form of hardware and software.

The random access memory 220 may store a firmware or a software to be driven by the control unit 210. Also, the random access memory 220 may store data necessary for driving the firmware or the software, for example, management data, such as an address mapping information. For example, the random access memory 220 may operate as a working memory of the control unit 210.

The data buffer memory 230 may temporarily store data to be transmitted between the host device and the nonvolatile memory device 300. The data buffer memory 230 may also be referred to as a data cache memory. For example, the data buffer memory 230 may temporarily store data to be transmitted from the nonvolatile memory device 300 to the host device. For example, data RDT read out from the nonvolatile memory device 300 may be error-corrected by the error correction code (ECC) unit 240 to become decoded data DDT, and the decoded data DDT may then be temporarily stored in the data buffer memory 230. The decoded data DDT stored in the data buffer memory 230 may be provided to the host device.

The error correction code (ECC) unit 240 may correct an error included in the data RDT read out from the nonvolatile memory device 300. For correcting an error included in the read-out data RDT, the ECC unit 240 may include a decoding control block 241, a first decoder group 245, and a second decoder group 247. The first decoder group 245 may include a plurality of first type decoders 245a to 245m. The second decoder group 247 may include a plurality of second type decoders 247a to 247n.

Although not shown, the ECC unit 240 may include blocks for encoding data transmitted from the host device.

The decoding control block 241 may manage a lookup table LUT based on the characteristic of the nonvolatile memory device 300 included in the data storage device 100, the characteristics of the first and second decoder groups 245 and 247, and the results of decoding operations of the first and second decoder groups 245 and 247.

The decoding control block 241 may control decoding operations of the first and second decoder groups 245 and 247 according to the lookup table LUT. For example, the decoding control block 241 may control the power consumption and processing amounts per unit of time (hereafter, referred to as throughputs) for each of the first and second decoder groups 245 and 247 according to the lookup table LUT. The decoding operations may be optimized through the management of the lookup table LUT and the control of the power consumptions and throughputs of the first and second decoder groups 245 and 247 according to the lookup table LUT.

The decoding control block 241 may control available decoders selected form the plurality of the first type decoders 245a to 245m of the first decoder group 245 for decoding the read-out data RDT. Although not shown, in the case where the read-out data RDT is transmitted in parallel through a number of channels, the decoding control block 241 may control one or more first type decoders, which are available or have higher priorities for the decoding operation, to decode the read-out data RDT.

The decoding control block 241 may control the second decoder group 247 to perform the decoding operation to the read-out data RDT when the decoding operation of the first decoder group 245 for the read-out data RDT fails. In other words, when one or more of the first type decoders 245a to 245m of the first decoder group 245 fail in correcting errors in the read-out data RDT, the decoding control block 241 may control one or more of the second type decoders 247a to 247n of the second decoder group 247 to correct errors in the read-out data RDT.

Each of the first type decoders 245a to 245m of the first decoder group 245 and the second type decoders 247a to 247n of the second decoder group 247 may be an ECC decoder employing an iterative error correction scheme. For example, each of the first type decoders 245a to 245m and the second type decoders 247a to 247n may iteratively perform a decoding operation to the read-out data RDT by a predetermined number of iterations or until the decoding operation is successful.

The first and second type decoders 245a to 245m and 247a to 247n may have different characteristics. For example, the degree of integration of the second decoder group 247 may be smaller than the degree of integration of the first decoder group 245. That is to say, the size of each second type decoder may be larger than the size of each first type decoder.

For another example, the error correction capability of the second decoder group 247 may be greater than the error correction capability of the first decoder group 245. In other words, each second type decoder may correct a larger number of errors than each first type decoder does.

For another example, the power consumption of the second decoder group 247 may be larger than the power consumption of the first decoder group 245. Namely, power consumed by each second type decoder per one clock may be larger than power consumed by each first type decoder per one dock. In the following descriptions, power consumptions of decoders will be described as normalized values. For instance, power consumed by one first type decoder per one dock will be normalized as "1," and power consumed by one second type decoder per one dock ill be normalized as "4," which means that the power consumption of the second type decoder is four times larger than the power consumption of the first type decoder.

Figure 2:
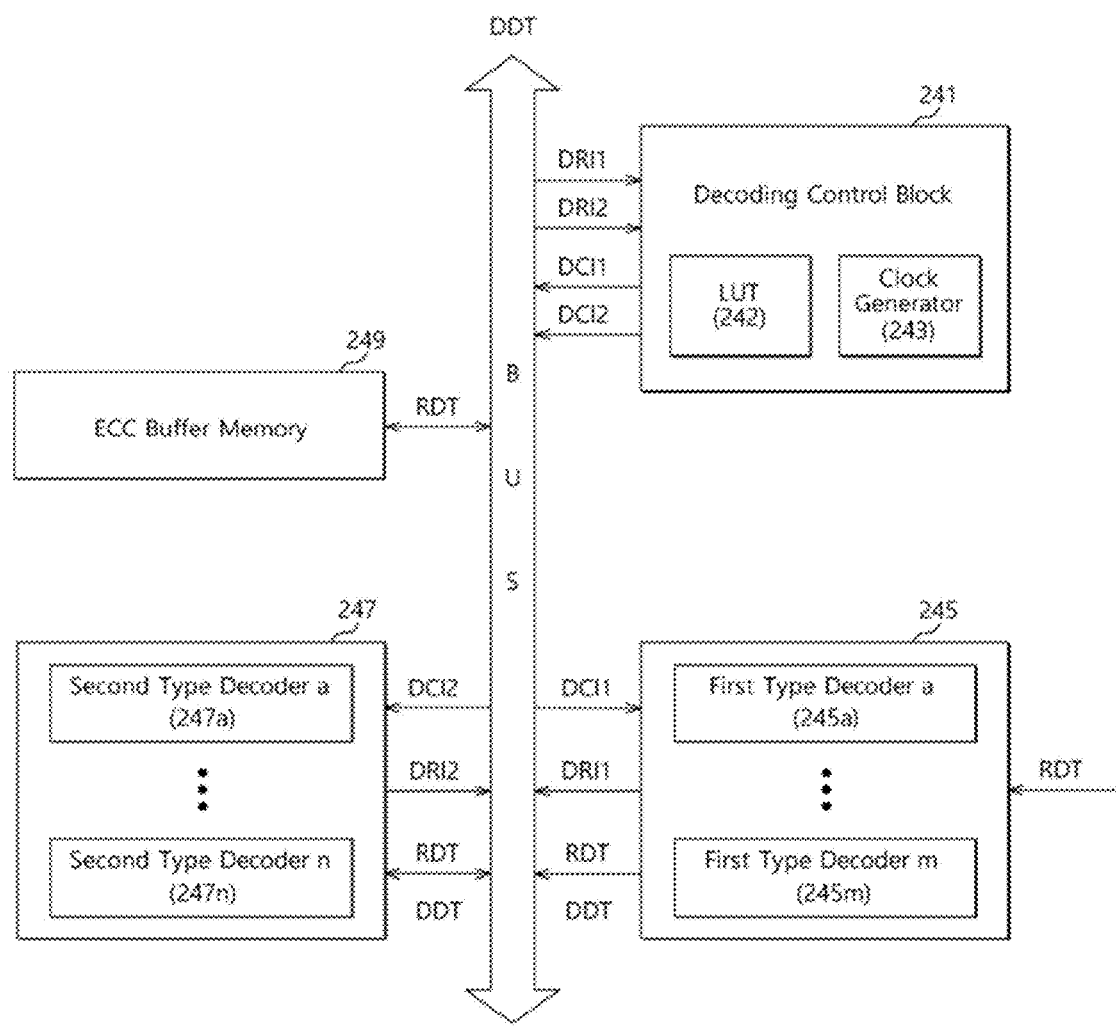
FIGS. 2 to 4 are block diagrams illustrating examples of the error correction code (ECC) unit shown in FIG. 1.
Figure 3:
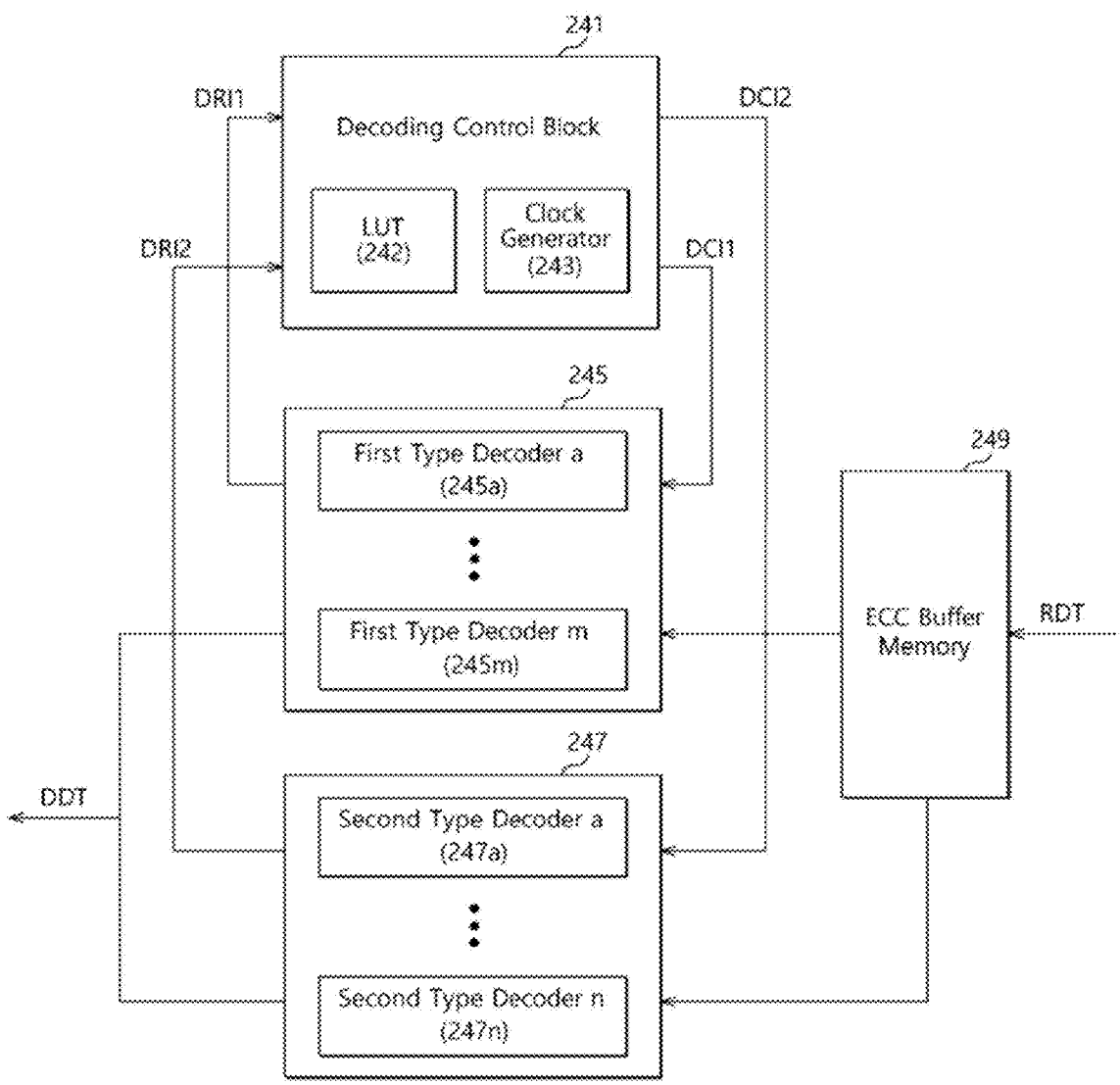
Figure 4:
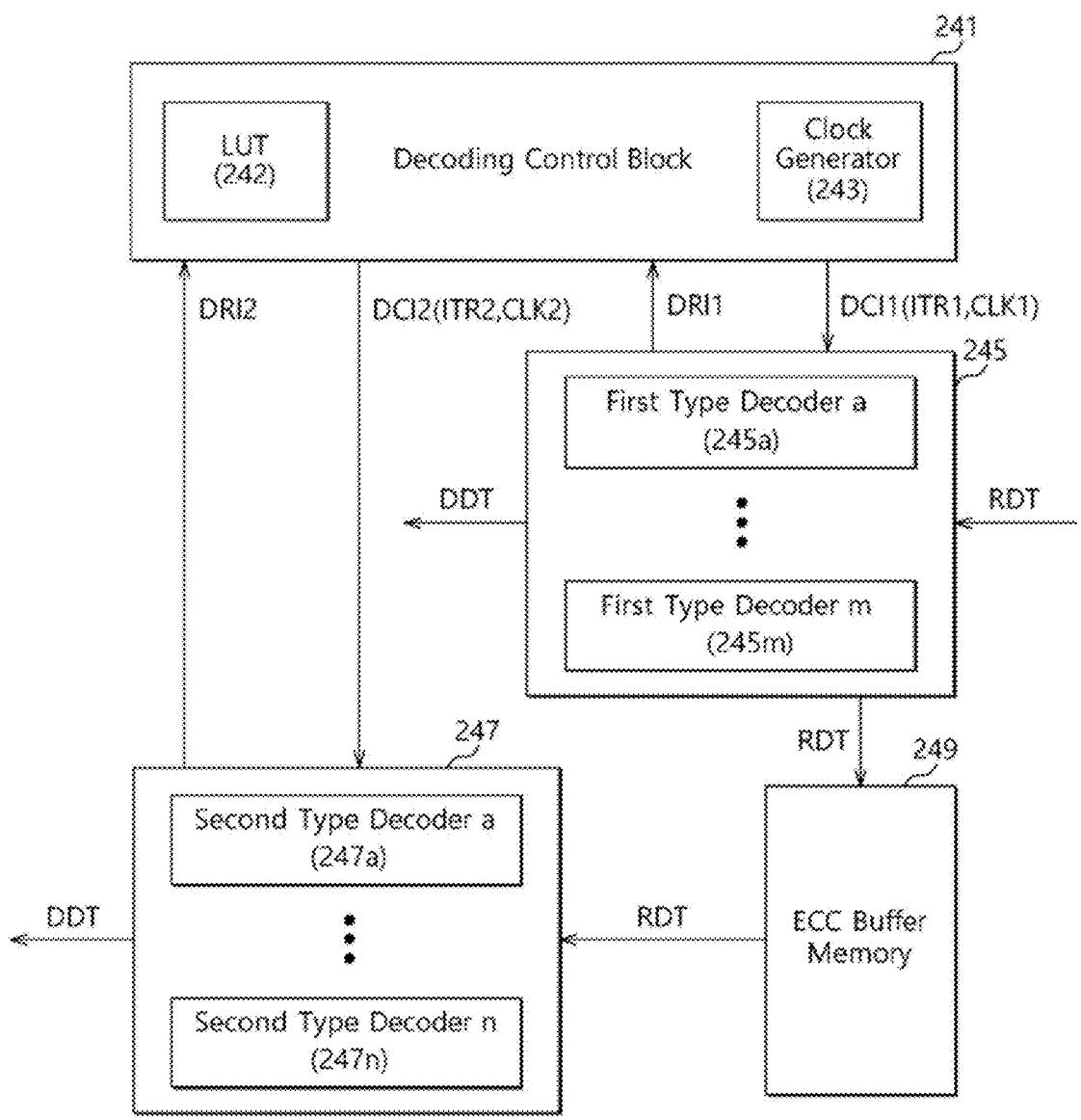

FIGS. 2 to 4 are block diagrams illustrating examples of the ECC unit 240 shown in FIG. 1.

Referring to FIG. 2, information (or signals) DCI1, DCI2, DRI1 and DRI2 and data RDT and DDT may be transmitted through a bus BUS between internal blocks 241, 245, 247 and 249 in the ECC unit 240.

The decoding control block 241 may provide the first and second decoder groups 245 and 247 with decoding control information DCI1 and DCI2, respectively. Control information DCI1 may be employed for controlling the first type decoders 245a to 245m of the first decoder group 245. Control information DCI2 may be employed for controlling the second type decoders 247a to 247n of the second decoder group 247.

The first decoder group 245 may transmit the read-out data RDT to the ECC buffer memory 249 while decoding the read-out data RDT or when the first decoder group 245 fails in correcting errors in the read-out data RDT. The first decoder group 245 may transmit decoded data DDT to the data buffer memory 230 through the bus BUS when the first decoder group 245 successfully corrects errors in the read-out data RDT. The first decoder group 245 may transmit decoding result information DRI1 on a result of the decoding operation thereof to the decoding control block 241.

The second decoder group 247 may perform the decoding operation to the read-out data RDT stored in the ECC buffer memory 249. The second decoder group 247 may transmit decoded data DDT to the data buffer memory 230 through the bus BUS when the second decoder group 247 successfully corrects errors in the read-out data RDT. The second decoder group 247 may transmit decoding result information DRI2 on a result of a decoding operation thereof to the decoding control block 241.

Referring now to FIG. 3, the ECC unit 240 may be configured so that the information (or signals) DCI1, DCI2, DRI1, and DRI2 are transmitted between internal blocks 241, 245 and 247 through signal lines configured for transmitting such information or signals). The ECC unit 240 may also be configured so that data RDT and DDT are transmitted between internal blocks 245, 247 and 249 through data lines configured for transmitting such data.

The ECC buffer memory 249 may buffer the read-out data RDT from the nonvolatile memory device 300.

The decoding control block 241 may transmit the decoding control information DCI1 and DCI2 to the first and second decoder groups 245 and 247, respectively.

The first decoder group 245 may perform the decoding operation to the read-out data RDT stored in the ECC buffer memory 249. The first decoder group 245 may transmit decoded data DDT to the data buffer memory 230 when the first decoder group 245 successfully corrects errors in the read-out data RDT. The first decoder group 245 may transmit the decoding result information DRI1 to the decoding control block 241.

When the first decoder group 245 fails in correcting errors in the read-out data RDT, the second decoder group 247 may perform the decoding operation to the errors of the read-out data RDT stored in the ECC buffer memory 249. The second decoder group 247 may transmit decoded data DDT to the data buffer memory 230 when the second decoder group 247 successfully corrects errors in the read-out data RDT. The second decoder group 247 may transmit the decoding result information DRI2 to the decoding control block 241.

Referring now to FIG. 4, the ECC unit 240 may be configured so that the information (or signals) DCI1, DCI2, DRI1 and DRI2 are transmitted between internal blocks 241, 245 and 247 through signal lines configured for transmitting such information (or signals). The ECC unit 240 may also be configured so that data RDT and DDT are transmitted between internal blocks 245, 247 and 249 through data lines configured for transmitting such data.

The decoding control block 241 may transmit the decoding control information DCI1 and DCI2 to the first and second decoder groups 245 and 247, respectively.

The first decoder group 245 may transmit the read-out data RDT to the ECC buffer memory 249 while decoding the read-out data RDT or when the first decoder group 245 fails in correcting errors in the read-out data RDT. The first decoder group 245 may transmit decoded data DDT to the data buffer memory 230 when the first decoder group 245 successfully corrects errors in the read-out data RDT. The first decoder group 245 may transmit the decoding result information DRI1 to the decoding control block 241.

When the first decoder group 245 fails in correcting errors in the read-out data RDT, the second decoder group 247 may perform the decoding operation to the errors of the read-out data RDT stored in the ECC buffer memory 249. The second decoder group 247 may transmit decoded data DDT to the data buffer memory 230 when the second decoder group 247 successfully corrects errors in the read-out data RDT. The second decoder group 247 may transmit the decoding result information DRI2 to the decoding control block 241.

In the following descriptions, for simplicity, the block diagram of the ECC unit 240 shown in FIG. 4 will be described as a block diagram representing the block diagrams of the ECC unit 240 shown in FIGS. 2 and 3. However, the configurations, operations and functions of internal blocks of the ECC unit 240 may be the same.

Referring now to FIG. 4, the first decoder group 245 may transmit the first decoding result information DRI1 to the decoding control block 241. The first decoding result information DRI1 may include results of respectively completed decoding operations of one or more of the first type decoders 245a to 245m. For example, the first decoding result information DRI1 may include results of individually completed decoding operations of one or more of the first type decoders 245a to 245m.

The second decoder group 247 may transmit the second decoding result information DRI2 to the decoding control block 241. The second decoding result information DRI2 may include results of respectively completed decoding operations of one or more of the second type decoders 247a to 247n. For example, the second decoding result information DRI2 may include results of individually completed decoding operations of one or more of the second type decoders 247a to 247n.

The decoding result information DRI1 or DRI2 may include decoding pass/fail information indicating whether the respective decoding operation has succeeded or failed.

The decoding result information DRI1 or DRI2 may include iterative performance count information ITRCNT representing the number of iterations that the respective decoding operation has been performed to the same read-out data RDT.

The decoding result information DRI1 or DRI2 may include error count information ERRCNT representing the number of errors included in the decoded data.

The decoding result information DRI1 or DRI2 may be used for managing the lookup table LUT. For example, the decoding result information DRI1 or DRI2 may be used for updating a decoding fail rate FR included in the lookup table LUT so that a current state of the nonvolatile memory device 300 may be reflected to the decoding fail rate FR.

The decoding control block 241 may generate the first and the second decoding control information DCI1 and DCI2 by referring to the lookup table LUT. For example, the first decoding control information DCI1 may include an information for controlling at least one among the first type decoders 245a to 245m of the first decoder group 245. In an embodiment, the first decoding control information DCI1 may include an information for controlling all the first type decoders 245a to 245m of the first decoder group 245.

The second decoding control information DCI2 may include an information for controlling at least one among the second type decoders 247a to 247n of the second decoder group 247. In an embodiment, the second decoding, control information DCI2 may include an information for controlling all the second type decoders 247a to 247n of the second decoder group 247.

The decoding control information DCI1 or DCI2 may each include an iteration count information ITR representing a maximum iteration number that the respective decoding operation can be performed to the read-out data RDT.

The decoding control information DCI1 or DCI2 may include clock information CLK1 and CLK2 for the decoding operation. A clock generator 243 may generate a clock signal for the decoding operation by referring to the decoding control information DCI1 or DCI2.

It is noted that the characteristics of the nonvolatile memory device 300 may differ between different manufacturers using different manufacturing technologies. Also, even when the nonvolatile memory device 300 is manufactured using the same manufacturing technology, the characteristics of the nonvolatile memory device 300 may differ according to manufacturing environment and use circumstances of individual nonvolatile memory device 300.

Figure 5:
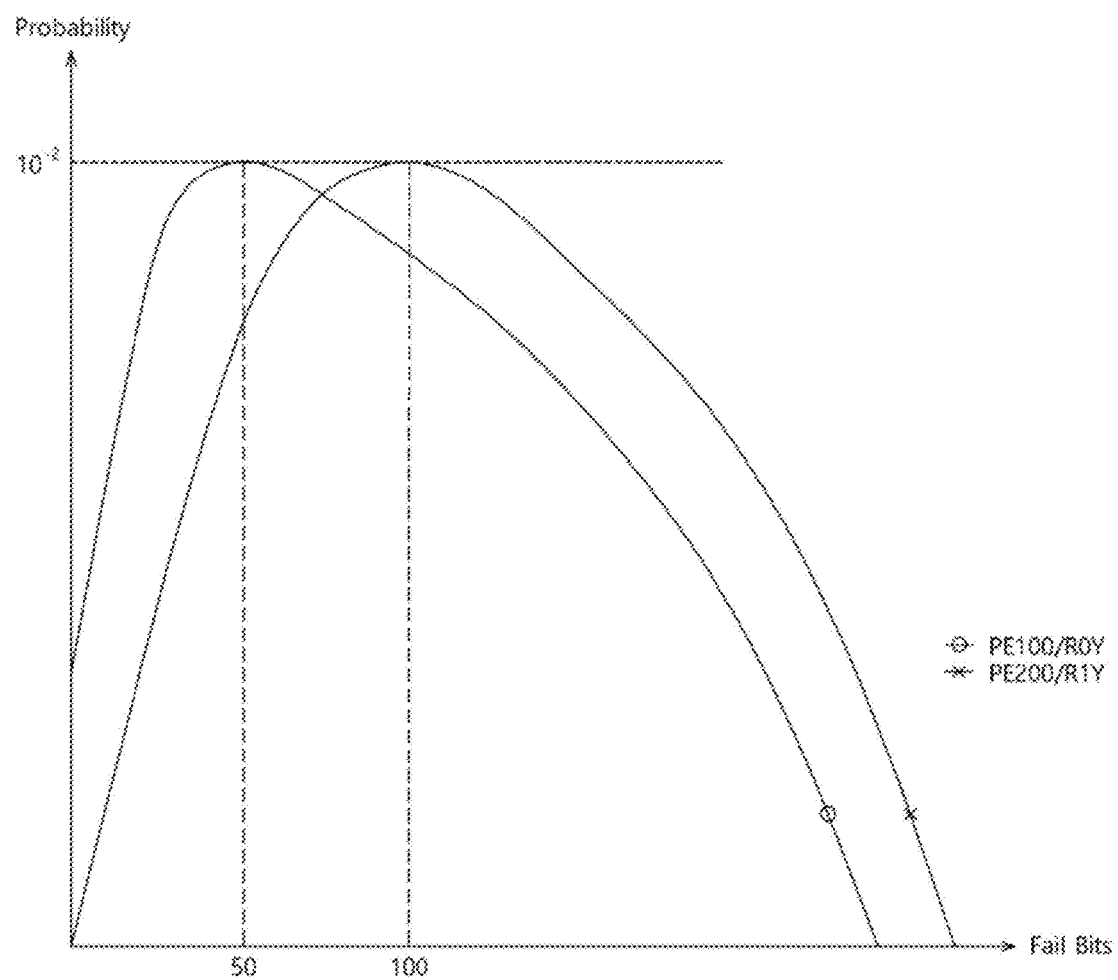
FIG. 5 is a graph illustrating an example of error rates of a nonvolatile memory device in specific states, according to an embodiment of the invention.

FIG. 5 is a graph illustrating examples of error rates of the nonvolatile memory device 300 in specific states of the nonvolatile memory device. FIG. 5 exemplarily shows the error rates of the nonvolatile memory device 300 by testing a specified nonvolatile memory device.

As exemplified in FIG. 5, the error rate of the nonvolatile memory device 300 may vary according to a program/erase count PE and a retention time R after programming.

Referring to FIG. 5, when 0 year elapses after data is programmed in a nonvolatile memory device which is programmed/erased 100 times (denoted as "PE100/R0Y"), errors of 50 bits may be included in the programmed data with a probability of 1%. Also, when 1 year elapses after data is programmed in a nonvolatile memory device which is programmed/erased 200 times (denoted as "PE200/R1Y"), errors of 100 bits may be included in the programmed data with a probability of 1%.

The error rates of a nonvolatile memory device may be obtained or defined for initial generation of the lookup table LUT.

Figure 6:
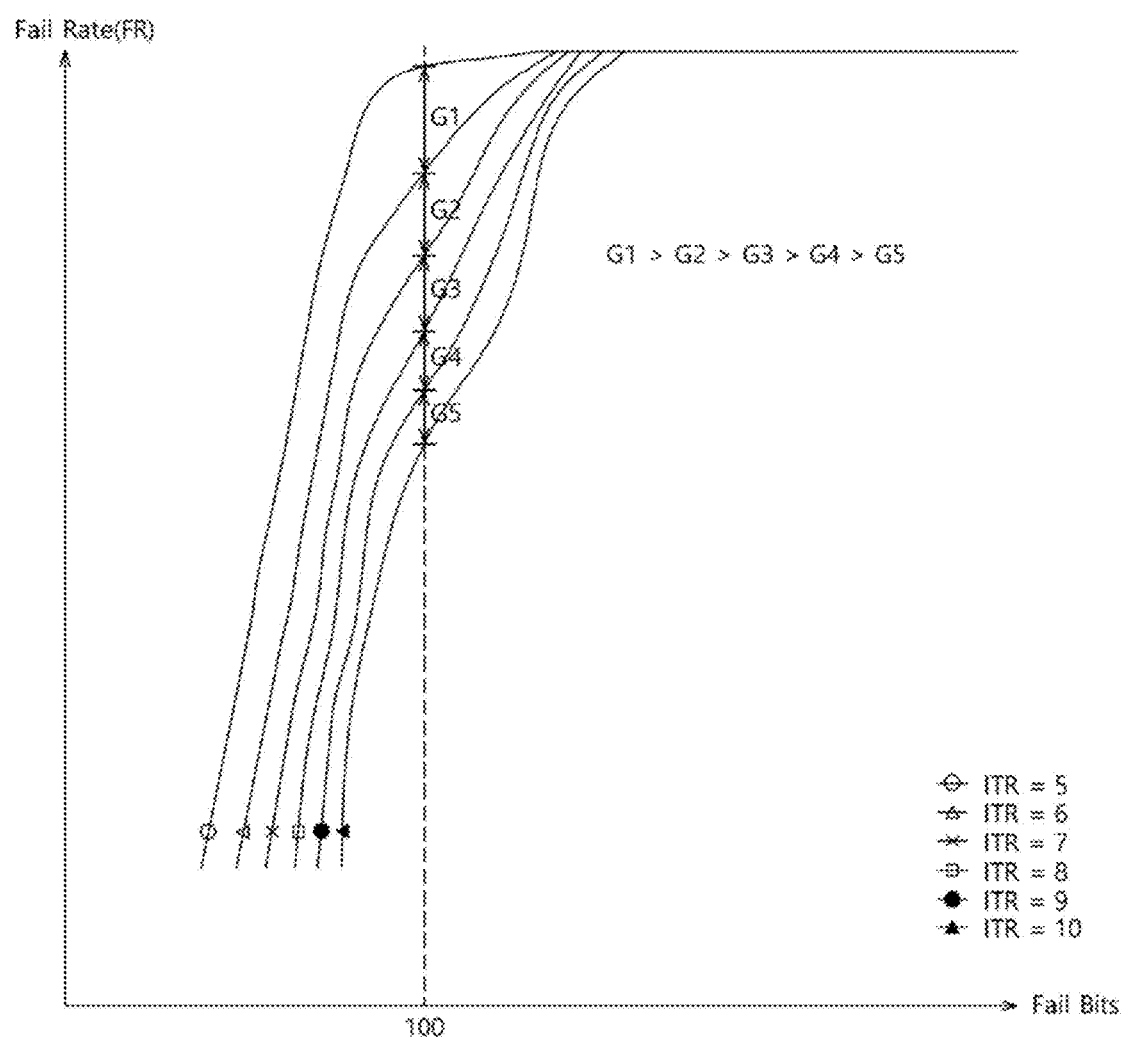
FIG. 6 is a graph illustrating decoding fail rates of first type decoders of a first decoder group, as a function of the number of iterations of an error correction decoding operation, according to an embodiment of the invention.

FIG. 6 is a graph illustrating examples of decoding fail rates FR of the first type decoders 245a to 245m of the first decoder group 245. FIG. 6 exemplarily shows the decoding fail rates FR of the nonvolatile memory device 300 by decoding data including a 100-bit error.

It should be understood that the ECC decoders (i.e., the first type decoders 245a to 245m of the first decoder group 245) may differ in their characteristics including the decoding fail rates FR according to how they are designed. Further, the ECC decoders (i.e., the first type decoders 245a to 245m of the first decoder group 245) may differ in the decoding fail rates FR according to the iteration number of the performed decoding operations thereof.

As exemplified in FIG. 6, the decoding fail rates FR of the first type decoders 245a to 245m may decrease as the decoding operation is iterated.

Referring to FIG. 6, as the iteration number of the decoding operation to the data including the 100-bit error increases from 5 to 10 times, the decoding fail rates FR decrease. It may be seen that differences G1 to G5 between the decoding fail rates FR of successive decoding operations gradually decreases as the number of iterations of the decoding operation to the data including the 100-bit error increases from 5 to 10 times.

The decoding fail rates FR of the first type decoders 245a to 245m of the first decoder group 245 may be obtained or defined for initial generation of the lookup table LUT. As described above, the decoding fail rate FR may be updated based on the decoding result information DRI1 or DRI2 so that the current state of the nonvolatile memory device 300 is reflected to the decoding fail rate FR.

Figure 7:
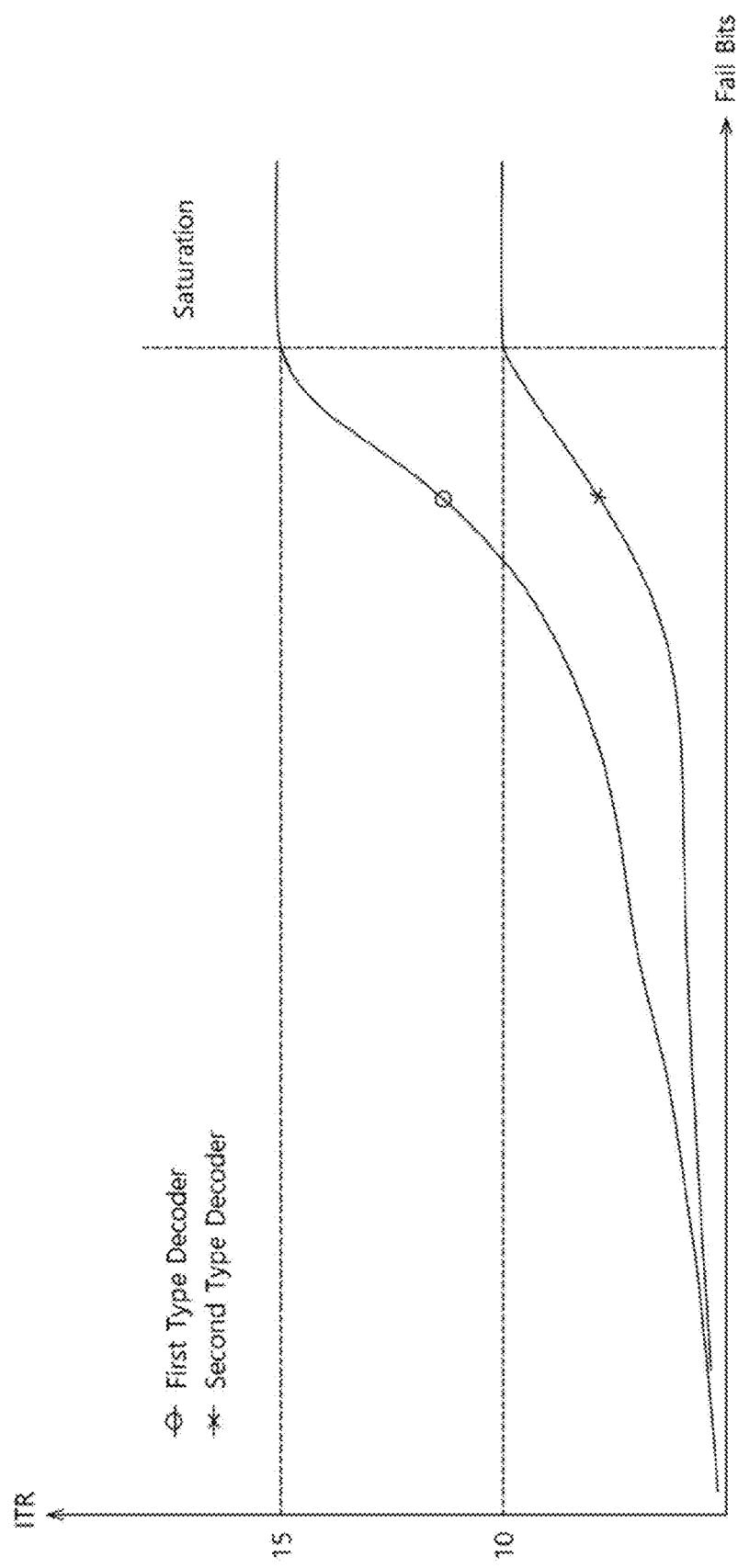
FIG. 7 is a graph illustrating saturation characteristics of error correction decoding operations of first and second type decoders, according to an embodiment of the invention.

FIG. 7 is a graph illustrating the saturation characteristics of the decoding operations of the first and second type decoders 245a to 245m and 247a to 247n, respectively, as a function of the number of iterations.

It is noted that the ECC decoders (i.e., the first type decoders 245a to 245m of the first decoder group 245 and the second type decoders 247a to 247n of the second decoder group 247) may differ in their specific characteristics including their decoding saturation characteristics depending upon their specific design. The decoding saturation characteristic may be manifested at a decoding saturation state when the decoding operation of the ECC decoder with a distinguishing number of iterations is successful regardless of a number of error bits included in the read-out data RDT. Without limitation of the power consumption and the operation time of the ECC decoder, the decoding operation with the distinguishing number of iterations may succeed regardless of the number of error bits.

In the example of FIG. 7, each of the first type decoders 245a to 245m of the first decoder group 245 may enter its own decoding saturation state when the decoding operation thereof is iterated 15 times. Moreover, each of the second type decoders 247a to 247n of the second decoder group 247 may enter its own saturation state when the decoding operation thereof is iterated 10 times.

As described above, when the decoding operations of the first type decoders 245a to 245m of the first decoder group 245 fail, the decoding operations of the second type decoders 247a to 247n of the second decoder group 247 may be performed. According to an embodiment of the present disclosure, the second decoder group 247 is the last decoder group performing the ECC decoding operation and therefore the second decoder group 247 preferably needs may succeed in correcting the errors in the read-out data RDT. Therefore, while the value of the iteration count information ITR of the first decoder group 245 may dynamically vary through the decoding control block 241, the value of the iteration count information ITR of the second decoder group 247 may be fixed to the iteration count required for reaching the saturation state of the second type decoders 247a to 247n (i.e. 10 times in the example illustrated in FIG. 7) for ensuring that the second decoder group 247 may succeed in correcting the errors in the read-out data RDT.

The iteration count required for reaching the saturation state of the second type decoders 247a to 247n of the second decoder group 247 may be obtained or defined for an initial generation of the lookup table LUT.

Figures 8, 9:
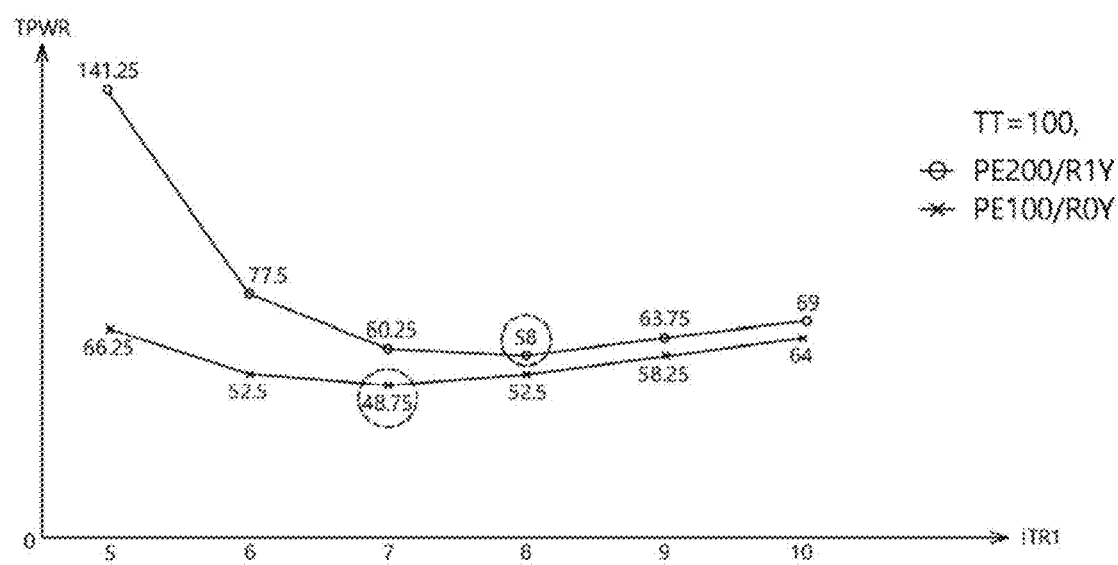
FIG. 8 is a lookup table for generating decoding control information, according to an embodiment of the invention.
FIG. 9 is a graph illustrating total power consumption values of both of the first and the second decoders as a function of the number of iterations of the error decoding operation of the first decoders for two specific states of a nonvolatile memory device, according to an embodiment of the invention.

FIG. 8 is an example of a lookup table LUT which may be referred to generate the decoding control information DCI1 and DCI2.

FIG. 8 exemplarily shows the lookup table LUT generated on the basis of the error rates of the nonvolatile memory device 300 in the specific states as described with reference to FIG. 5, the decoding fail rates FR of the first decoder group 245 as described with reference to FIG. 6 and the saturation characteristic of the second decoder group 247 as described with reference to FIG. 7.

When the first decoder group 245 having the decoding fail rates FR shown in FIG. 6 performs its decoding operation to the nonvolatile memory device 300 in the specific states corresponding to the error rates shown in FIG. 5 (i.e. PE100/R0Y and PE200/R1Y), the lookup table LUT may include the decoding fail rates FR according to the iteration count information ITR1 of the first type decoders 245a to 245m, as shown in FIG. 8.

Also as exemplified in FIG. 8, the lookup table LUT may include the iteration count information ITR2 of the second type decoders 247a to 247n of the second decoder group 247, to which the saturation characteristic of the second decoder group 247 as described with reference to FIG. 7 is reflected. As described above, while the value of the iteration count information ITR1 of the first decoder group 245 may dynamically vary, the value of the iteration count information ITR2 of the second decoder group 247 may be fixed to the iteration count required for reaching the saturation state of the second type decoders 247a to 247n (i.e., 10 iterations for the example illustrated in FIG. 7) for ensuring that the second decoder group 247 may succeed in correcting the errors in the read-out data RDT.

The lookup table LUT may be initially determined according to characteristics of the nonvolatile memory device 300 and the ECC unit 240 to be included in the data storage device 100. Because various information are diagrammed, the term, lookup table LUT is used. However, the lookup table LUT including various information, that is, information on the error rates of the nonvolatile memory device, the decoding fail rates of the first decoder group and the saturation characteristic of the second decoder group, may be referred to as a reference information.

FIG. 9 is an example of a graph of total power consumption values TPWR (shown in the last column of a table of FIG. 10) for both the first decoder group 245 and the second decoder group 247 for illustrating controlling the error decoding operation of the first type decoders 245a to 245m of the first decoder group 245 and the second type decoders 247a to 247n of the second decoder group 247 based on the decoding control information (DCI). FIG. 9 exemplarily shows normalized total power consumption values TPWR of the first decoder group 245 and the second decoder group 247 when the first decoder group 245 and the second decoder group 247 perform the decoding operations according to the lookup table LUT of FIG. 8.

As can be seen from FIG. 9, the specific state of the nonvolatile memory device 300 represented by the program/erase count PE and the elapsed time R after programming as described with reference to FIG. 5 and the iteration count ITR1 of the first decoder group 245 may affect the total power consumption value TPWR of both of the first decoder group 245 and the second decoder group under a condition where a normalized target throughput TT of the first decoder group 245 and the second decoder group 247 is retained to "100".

Also as can be seen from FIG. 9, the total power consumption value TPWR does not reach a minimum value at the lowest or highest values of the iteration count ITR1 under a condition where a normalized target throughput TT of the first decoder group 245 and the second decoder group 247 is retained to "100".

Referring to FIG. 9, for the "PE100/R0Y" specific status of the nonvolatile memory device, i.e., when 0 year elapses after data is programmed in the nonvolatile memory device which is programmed/erased 100 times, the normalized total power consumption value TPWR obtains a minimum value of "48.75" when the first decoder group 245 iteratively performs its decoding operation 7 times, i.e. at a first iteration count ITR1 of 7. Also, when 1 year elapses after data is programmed in a nonvolatile memory device which is programmed/erased 200 times (denoted as "PE200/R1Y"), the normalized total power consumption value TPWR reaches a minimum value of "58" when the first decoder group 245 iteratively performs its decoding operation 8 times, i.e. at a first iteration count ITR of 8.

According to an embodiment of the present invention, the decoding control block 241 may control the decoding operations of the first decoder group 245 and the second decoder group 247 in such a manner that the first decoder group 245 and the second decoder group 247 consume minimal (or optimal) power while the target throughput TT is retained to the predetermined value. The decoding control block 241 may control the decoding operations of the first decoder group 245 and the second decoder group 247 in real time or dynamically.

For example, the decoding control block 241 may transmit the first and second decoding control information DCI1 and DCI2 to the first and second decoder groups 245 and 247, respectively.

As described above, the decoding control information DCI1 or DCI2 may include the iteration count information ITR representing a maximum iteration number that the respective decoding operation can be performed to the read-out data RDT, and respectively include the clock information CLK1 and CLK2 for the decoding operations of the first and second decoder groups 245 and 247. The first and second decoder groups 245 and 247 may perform their decoding operations according to the iteration count information ITR and the clock signals included in the first and second decoding control information DCI1 and DCI2.

Figure 11:
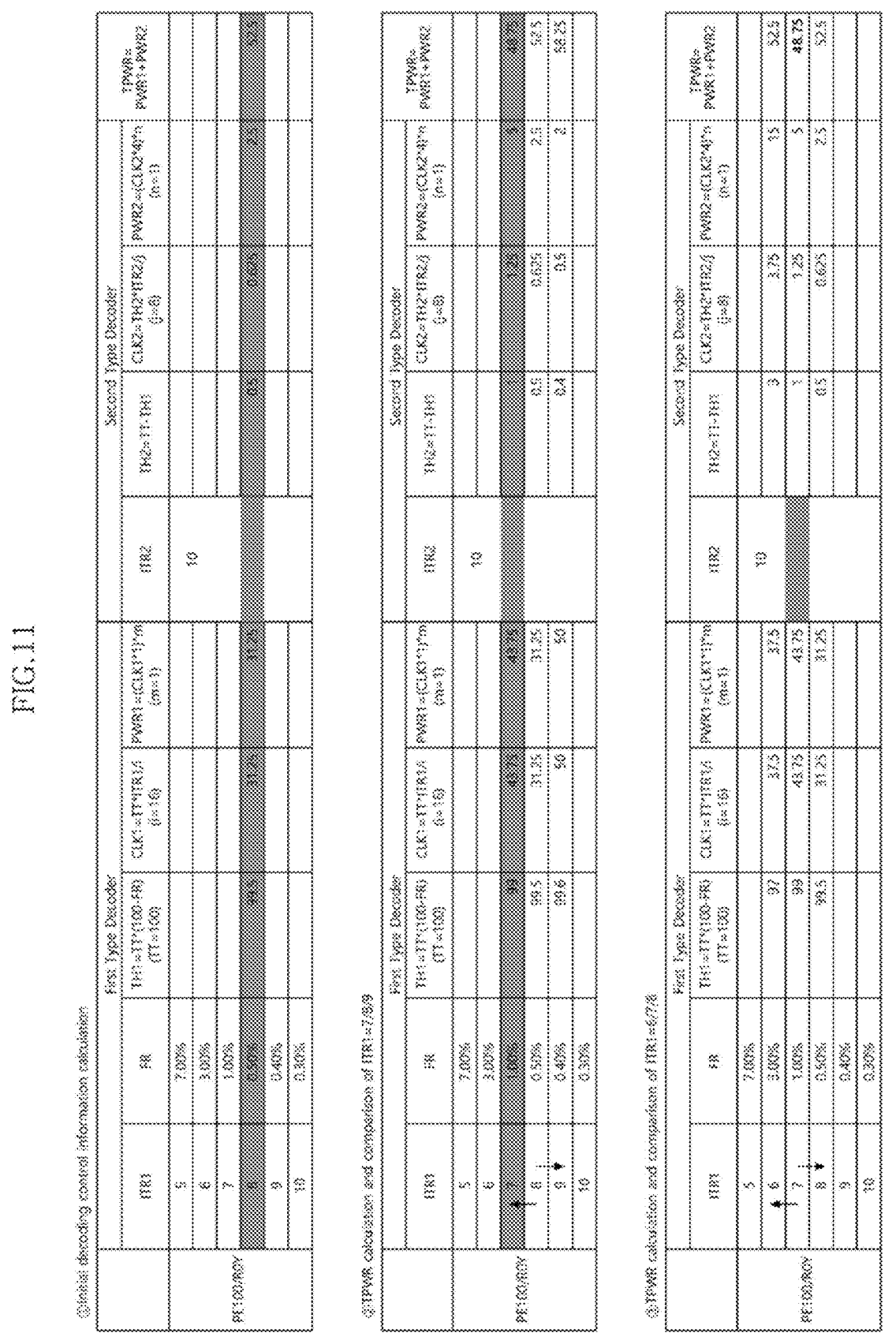

FIGS. 10 and 11 are examples of tables to assist in the explanation of processes for the decoding control block 241 to generate the first decoding control information DCI1 and the second decoding control information DCI2.

It is assumed that the target throughput TT of the first decoder group 245 and the second decoder group 247 is retained to a normalized value "100".

It is further assumed that the first decoder group 245 comprises a single first type decoder (m=1). Moreover, it is assumed that a unit processing amount "i" of the single first type decoder is set as "16."

It is assumed that the second decoder group 247 comprises a single second type decoder (n=1). Moreover, it is assumed that a unit processing amount "j" of the single second type decoder is set as "8."

It is assumed that power consumed by the single, first type decoder per each clock is set to a normalized value "1" (Pn1=1). Also, it is assumed that power consumed by the single second type decoder per each clock is set to a normalized value "4" (Pn2=4).

The above assumptions may vary according to the specific characteristics of the nonvolatile memory device 300 and a design of the FCC unit 240.

Method 1: Generation of decoding control information (DCI) with all possible values of the total power consumption value information.

Referring to FIG. 10, the throughput TH1, dock information CLK1 and power consumptions PWR1 of the first type decoder; and the throughput TH2, clock information CLK2 and power consumptions PWR2 of the second type decoder may be obtained on the basis of the initial or updated lookup table LUT (as exemplified in FIG. 5) including the initial or updated decoding fail rates FR of the first type decoder as well as the iteration count information ITR1 and ITR2 of the first and second type decoders. As described above, the lookup table LUT may be generated on the basis of the error rates of the nonvolatile memory device 300 corresponding to the specific states as described with reference to FIG. 5, the decoding fail rates FR of the first decoder group 245 as described with reference to FIG. 6 and the saturation characteristic of the second decoder group 247 as described with reference to FIG. 7.

As an example FIG. 10 shows the cases of when 0 year elapses after data is programmed in a nonvolatile memory device which is programmed/erased 100 times (denoted as "PE100/R0Y") and when 1 year elapses after data is programmed in a nonvolatile memory device which is programmed/erased 200 times (denoted as "PE200/R1Y"). However, it is to be noted that the information exemplified in FIG. 10 may be obtained for each state (that is, each program/erase count PE and each elapsed time R after programs of a nonvolatile memory device.

The decoding control block 241 may obtain the throughput TH1, clock information CLK1 and power consumptions PWR1 of the first type decoder; the throughput TH2, clock information CLK2 and power consumptions PWR2 of the second type decoder; and the total power consumption amounts TPWR for each state of the nonvolatile memory device through the following equations. Symbols in the equations are described above.

$$TH1 = TT*(100-FR) \qquad \text{[Equation 1]}$$

$$CLK1 = TT*ITR1/i \qquad \text{[Equation 2]}$$

$$PWR1=(CLK1*Pn1)*m \quad \text{[Equation 3]}$$

$$TH2=TT-TH1 \quad \text{[Equation 4]}$$

$$CLK2=TH2*ITR2/j \quad \text{[Equation 5]}$$

$$PWR2=(CLK2*Pn2)*n \quad \text{[Equation 6]}$$

$$TPWR=PWR1+PWR2 \quad \text{[Equation 7]}$$

Equation 4 represents that the ECC unit 240 including the first and second type decoders may retain the target throughput TT. When the throughput TH1 of the first type decoder does not reach the target throughput TT, the throughput TH2 of the second type decoder may be the remaining throughput (e.g., "TT−TH1").

As described above, the decoding fail rate FR of the first type decoder may be updated on the basis of the decoding result information DRI1 or DRI2, and therefore the decoding control block 241 may also update the throughput TH1 of the first type decoder; the throughput TH2, clock information CLK2 and power consumptions PWR2 of the second type decoder; and the total power consumption values TPWR for each state of the nonvolatile memory device through the above equations according to the updated decoding fail rate FR of the first type decoder.

For example, in the case of decoding the read-out data RDT read out from the nonvolatile memory device when 0 year elapses after data is programmed in the nonvolatile memory device which is programmed/erased 100 times (denoted as "PE100/R0Y"), the first type decoder of the decoding fail rate FR of 7% (corresponding to 5 iteration counts) may be determined to have the throughput TH1 of "93" according to equation 1, the clock information CLK1 of "31.25" according to equation 2, and the power consumption PWR1 of "31.25" according to equation 3.

Likewise, the second type decoder may be determined to have the throughput TH2 of "7", the dock information CLK2 of "8.75", and the power consumption PWR2 of "35" according to equations 4 to 6. Through equation 7, the total power consumption amount TPWR of "66.25" may be obtained. As described above, the entry value of the iteration count information ITR2 of the second type decoder may be fixed to the iteration count "10" required for reaching the saturation state of the second type decoder for ensuring that the second type decoder may succeed in correcting the errors in the read-out data RDT.

In this way, the decoding control block 241 may obtain all possible respective values of the total power consumption information TPWR corresponding to the iteration count information ITR1 of the first type decoder for each state of the nonvolatile memory device, as exemplified in FIG. 10.

Among all possible values of the total power consumption information TPWR corresponding to the iteration count information ITR1 of the first type decoder for each state of the nonvolatile memory device, the decoding control block 241 may choose a minimum value of the total power consumption amount TPWR of the nonvolatile memory device.

The decoding control block 241 may generate the decoding control information DCI1 and DCI2 including the iteration count information ITR1 and ITR2 and the clock information CLK1 and CLK2 of the first and second type decoder, respectively, which correspond to the chosen total power consumption amount TPWR having the minimum value.

For instance, the decoding control block 241 may choose the total power consumption value TPWR of "48.75" as the minimum value. The decoding control block 241 may generate the decoding control information DCI1 including the iteration count information ITR1 of "7" and the clock information CLK1 of "43.75" of the first type decoder corresponding to the chosen total power consumption value TPWR of "48.75". The decoding control block 241 may generate the decoding control information DCI2 including the iteration count information ITR2 of "10" and the clock information CLK2 of "1.25" of the second type decoder corresponding to the chosen total power consumption value TPWR of "48.75".

For another instance, in the case of decoding the read-out data RIFT read out from the nonvolatile memory device when 1 year elapses after data is programmed in a nonvolatile memory device which is programmed/erased 200 times (denoted as "PE200/R1Y"), the decoding control block 241 may choose the total power consumption value TPWR of "58" as the minimum value. The decoding control block 241 may generate the decoding control information DCI1 including the iteration count information ITR1 of "8" and the clock information CLK1 of "50" of the first type decoder, which correspond to the chosen total power consumption value TPWR of "58". The decoding control block 241 may generate the decoding control information DCI2 including the iteration count information ITR2 of "10" and the clock information CLK2 of "2" of the second type decoder, respectively, which correspond to the chosen total power consumption value TPWR of "58".

[Method 2: Generation of Decoding Control Information (DCI) with Only a Part of All Possible Values of the Total Power Consumption Value information]

Referring to FIG. 11, the decoding control block 241 may tentatively obtain a currently minimum value of the total power consumption value TPWR through a part of all possible total power consumption amounts TPWR at the initial stage, and search for a substantially minimum value of the total power consumption value TPWR through another part of all possible total power consumption values TPWR on a "step-by-step" basis at each decoding operation of the first and second decoders. Because the decoding control information DCI1 and DCI2 are generated through only a part of all possible values of the total power consumption values TPWR, the decoding control block 241 may not need to obtain all possible values of the total power consumption values TPWR and the related information as described with reference to FIG. 10.

Similarly, as described above with reference to FIG. 10, the decoding control block 241 may obtain the currently or substantially minimum value of the total power consumption value TPWR based on the initial or updated lookup table LUT (as exemplified in FIG. 5) including the initial or updated decoding fail rates FR of the first type decoder as well as the iteration count information ITR1 and ITR2 of the first and second type decoders.

As an example, FIG. 11 shows the cases of when 0 year elapses after data is programmed in a nonvolatile memory device which is programmed/erased 100 times (denoted as "PE100/R0Y"). It is assumed that the decoding fail rate FR is kept to the previous value as a result of the update at each decoding operation of the first and second decoders.

In a first step ①  of FIG. 11, the decoding control block 241 may randomly choose an initial entry value from the entry values of the iteration count ITR1 of the first type decoder. The initial entry value of the iteration count ITR1 is randomly chosen at the initial stage.

Then, the decoding control block 241 may obtain the throughput. TH1, clock information CLK1 and power consumptions PWR1 of the first type decoder; the throughput TH2, clock information CLK2 and power consumptions PWR2 of the second type decoder; and the total power consumption values TPWR corresponding to the randomly selected initial entry value of the first iteration count ITR1 through equations 1 to 7 when 0 year elapses after data is programmed in the nonvolatile memory device which is programmed/erased 100 times (denoted as "PE100/R0Y").

For example, the decoding control block 241 may randomly choose the entry value "8" of the iteration count ITR1 of the first type decoder. The entry value "8" may be referred to also as the entry value of a currently minimum total power consumption value.

Then, the decoding control block 241 may obtain the throughput TH1 of "99.5", clock information CLK1 of "31.25" and power consumptions PWR1 of "31.25" of the first type decoder; the throughput TH2 of "0.5", clock information CLK2 of "0.625" and power consumptions PWR2 of "2.5" of the second type decoder; and the total power consumption values TPWR of "52.5" corresponding to the entry value "8" of currently minimum total power consumption value through equations 1 to 7. As described above, the entry value of the iteration count information ITR2 of the second type decoder may be fixed to the iteration count "10" required for reaching the saturation state of the second type decoder for ensuring that the second type decoder may succeed in correcting the errors in the read-out data RDT.

The decoding control block 241 may then generate the decoding control information DCI1 and DCI2. For example, the decoding control block 241 may generate the decoding control DCI1 including the iteration count information ITR1 of "8" and the clock information CLK1 of "31.25" of the first type decoder corresponding to the total power consumption value TPWR of "52.5" corresponding to the entry value "8" of currently minimum total power consumption value. Likewise, the decoding control block 241 may generate the decoding control information DCI2 including the iteration count information ITR2 of "10" and the clock information CLK2 of "0.625" of the second type decoder corresponding to the total power consumption value TPWR of "52.5" corresponding to the entry value "8" of currently minimum total power consumption value.

In the case where a next decoding operation is performed, the decoding control block 241 may control the first and second type decoders for ensuring that the total power consumption is optimized to a minimum value while satisfying the target throughput TT. To this end, the decoding control block 241 may perform an operation for searching a minimum value for the total power consumption amount TPWR corresponding to the entry value "8" of currently minimum total power consumption value and neighboring entry values greater and smaller than the entry value "8" of currently minimum total power consumption value.

In second step of FIG. 11, the decoding control block 241 may obtain the throughputs TH1 of "99" and "99.6", clock information CLK1 "43.75" and "50" and power consumptions PWR1 "43.75" and "50" of the first type decoder; the throughputs TH2 "1" and "0.4", clock information CLK2 "1.25" and "0.5" and power consumptions PWR2 "5" and "2" of the second type decoder; and the total power consumption values TPWR "48.75" and "58.25" corresponding to the neighboring entry values "7" and "9" greater and smaller than the entry value "8" of currently minimum total power consumption value through equations 1 to 7.

From the values "52.5", "48.75" and "58.25" for the total power consumption value TPWR corresponding to the entry value "8" of currently minimum total power consumption value and the neighboring entry values "7" and "9" of the entry value "8" of currently minimum total power consumption value, the decoding control block 241 may select the lower value "48.75" corresponding to the entry value "7". The entry value "7" may then be the entry value of currently minimum total power consumption value.

The decoding control block 241 may generate the decoding control information DCI1 and DCI2 including the respective iteration count information ITR1 of "7" and ITR2 of "10" and the respective clock information CLK1 of "43.75" and CLK2 of "1.25" of the first and second type decoder which correspond to the total power consumption value TPWR of "48.75" corresponding to the new updated entry value "7" of currently minimum total power consumption value.

In the case where a next decoding operation is performed, the decoding control block 241 may repeat an operation for searching a minimum value in the total power consumption amount TPWR corresponding to the entry value "7" of currently minimum total power consumption value and neighboring entry values greater and smaller than the entry value "7" of currently minimum total power consumption value.

In third step ③ of FIG. 11 the decoding control block 241 may obtain the throughputs TH1 of "97" and "99.5", clock information CLK1 "37.5" and "31.25" and power consumptions PWR1 "37.5" and "31.25" of the first type decoder; the throughputs TH2 "3" and "0.5", clock information CLK2 "3.75" and "0.625" and power consumptions PWR2 "15" and "2.5" of the second type decoder; and the total power consumption values TPWR "52.5" and "52.5" corresponding to the neighboring entry values "6" and "8" greater and smaller than the entry value "7" of currently minimum total power consumption value through equations 1 to 7.

Among the values "48.75", "52.5" and "52.5" in the total power consumption value TPWR corresponding to the entry value "7" of currently minimum total power consumption value and neighboring entry values "6" and "8" of the entry value "7" of currently minimum total power consumption value, the decoding control block 241 may select the minimum value "48.75" of the total power consumption value TPWR corresponding to the entry value "7" of currently minimum total power consumption value. The entry value "7" may be still the entry value of currently minimum total power consumption value.

The decoding control block 241 may generate the decoding control information DCI1 and DCI2 including the respective iteration count information ITR1 of "7" and ITR2 of "10" and the respective clock information CLK1 of "43.75" and CLK2 of "1.25" of the first and second type decoder corresponding to the total power consumption value TPWR of "48.75" corresponding to the entry value "7" of currently minimum total power consumption value.

Despite of the random choice of an initial entry value from the entry values of the iteration count ITR1 of the first type decoder at the initial stage in the first step ①, the decoding control block 241 may find a substantially minimum value of the total power consumption amount TPWR by iterating the searching operation as described above as the second step ② and the third step ③. That is to say, as the searching operation for the currently minimum value of the total power consumption amount TPWR is iteratively performed on a "step-by-step" basis in the course of the decoding operations of the first and second decoders, the value of the total power consumption amount TPWR may converge to the substantially minimum value.

As described above, the decoding control block 241 may provide the first and second decoder groups 245 and 247 with the decoding control information DCI1 and DCI2, respectively, which correspond to the chosen total power consumption value TPWR having the minimum value for controlling the first and second type decoders 245a to 245m and 247a to 247n.

Further, the first and second decoder groups 245 and 247 may provide the decoding control block 241 with the decoding result information DRI1 and DRI2 on the results of the decoding operation thereof, respectively. The decoding result information DRI1 or DRI2 may be used for updating the decoding fail rate FR included in the lookup table LUT so that the current state of the nonvolatile memory device 300 is reflected on the decoding fail rate FR.

Then, based on the updated LUT and thus updated total power consumption value TPWR having the minimum value, the decoding control block 241 may provide the first and second decoder groups 245 and 247 with the decoding control information DCI1 and DCI2, respectively, which correspond to the updated total power consumption value TPWR having the minimum value, which may be updated.

Hence, by updating the lookup table LUT, performance of the first type decoders 245a to 245m of the first decoder group 245 and the second type decoders 247a to 247n of the second decoder group 247 may be optimized.

Figure 12:
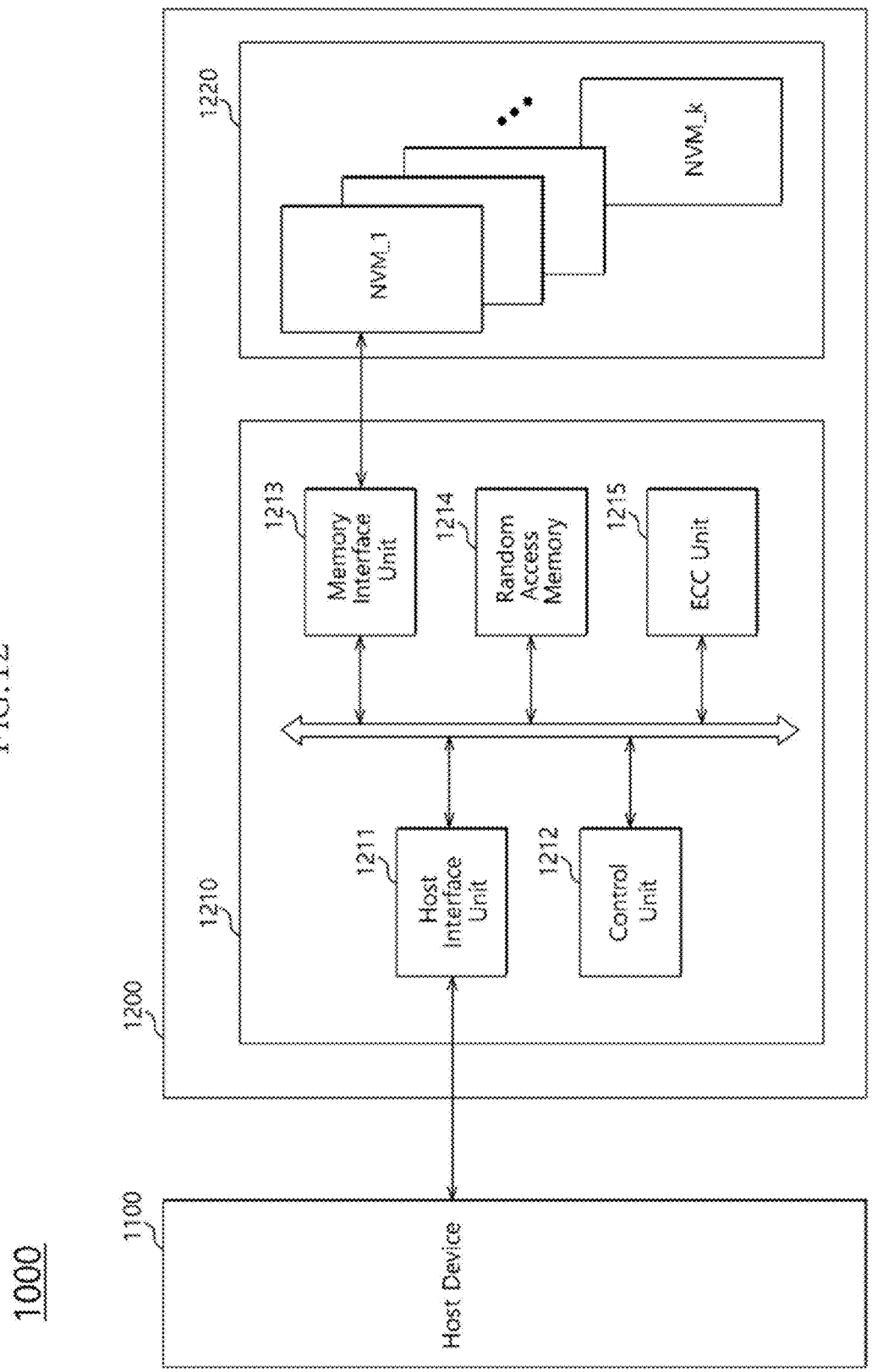
FIG. 12 is a block diagram illustrating a data processing system including a data storage device, according to an embodiment of the invention.

FIG. 12 is an example of a data processing system including a data storage device according to an embodiment of the invention. Referring to FIG. 12, a data processing system 1000 may include a host device 1100 and a data storage device 1200.

The data storage device 1200 may include a controller 1210 and a nonvolatile memory device 1220. The data storage device 1200 may be coupled to the host device 1100, such as, for example, a mobile phone, an MP3 player, a laptop computer, a desktop computer, a game player, a TV, an in-vehicle infotainment system, and the like. The data storage device 1200 is also referred to as a memory system.

The controller 1210 may include a host interface unit 1211, a control unit 1212, a memory interface unit 1213, a random access memory 1214, and an error correction code (ECC) unit 1215.

The control unit 1212 may control the general operations of the controller 1210 in response to a request from the host device 1100. The control unit 1212 may drive a firmware or a software for controlling the nonvolatile memory device 1220.

The random access memory 1214 may be used as a working memory of the control unit 1212. The random access memory 1214 may be used as a buffer memory for temporarily storing the data read from the nonvolatile memory device 1220 or the data provided is from the host device 1100.

The host interface unit 1211 may interface the host device 1100 and the controller 1210. For example, the host interface unit 1211 may communicate with the host device 1100 through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, a serial attached SCSI (SAS) protocol and the like.

The memory interface unit 1213 may interface the controller 1210 and the nonvolatile memory device 1220. The memory interface unit 1213 may provide commands and addresses to the nonvolatile memory device 1220. Furthermore, the memory interface unit 1213 may exchange data with the nonvolatile memory device 1220.

The error correction code (ECC) unit 1215 may ECC-encode data to be stored in the nonvolatile memory device 1220. Also, the error correction code (ECC) unit 1215 may decode data read out from the nonvolatile memory device 1220.

Although not shown, the error correction code (ECC) unit 1215 may include a first decoder group and a second decoder group. The error correction code (ECC) unit 1215 may control in real time or dynamically operations of the first decoder group and the second decoder group so that minimum power (or optimal) power may be, consumed while satisfying a target throughput, as described above.

The nonvolatile memory device 1220 may be used as the storage medium of the data storage device 1200. The nonvolatile memory device 1220 may include a plurality of nonvolatile memory chips (or dies) NVM_1 to NVM_k.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a Personal Computer Memory Card International Association (PCMCIA) card, a compact flash (CF) card, a smart media card, a memory stick, and the like.

Figure 13:
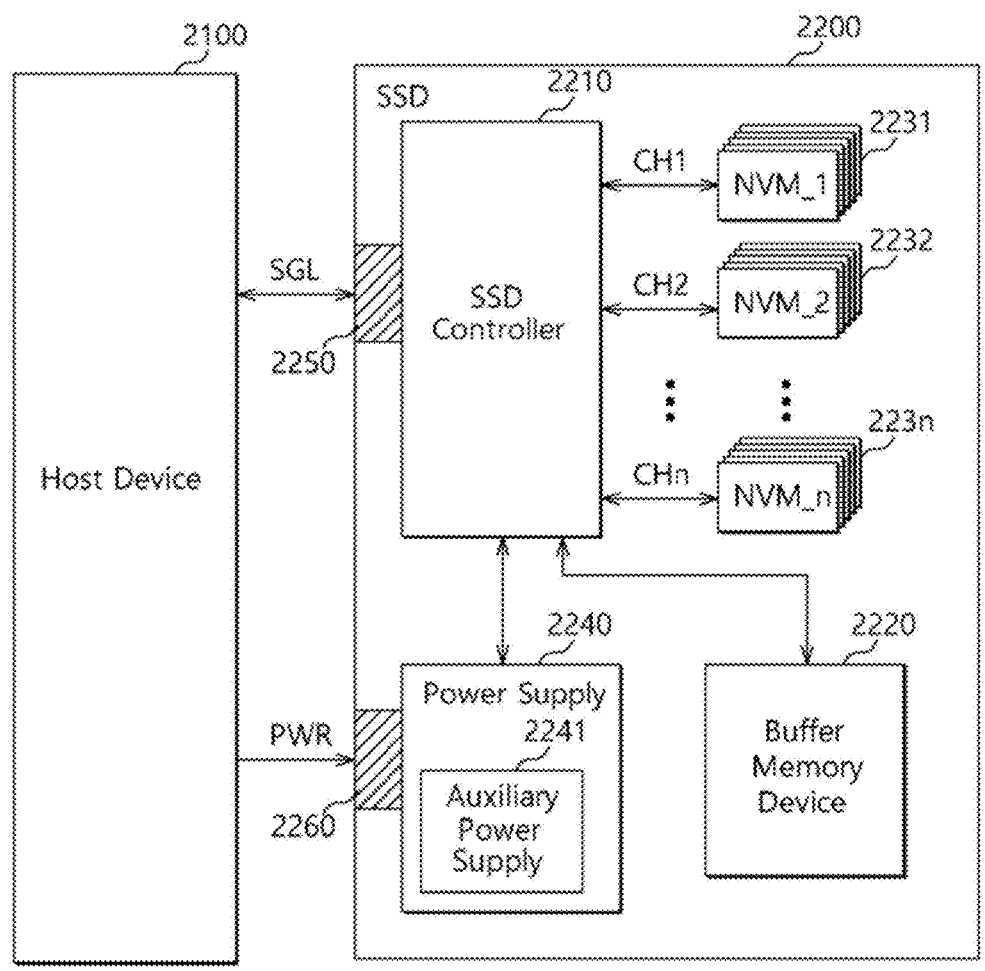
FIG. 13 is a block diagram illustrating a data processing system including a solid state drive (SSD), according to an embodiment of the invention.

FIG. 13 is a block diagram illustrating a data processing system including a solid state drive (SSD) according to an embodiment of the invention. Referring to FIG. 13, a data processing system 2000 may include a host device 2100 and a solid state drive (SSD) 2200.

The SSD 2200 may include an SSD controller 2210, a buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100.

The buffer memory device 2220 may temporarily store data which are to be stored in the nonvolatile memory devices 2231 to 223n. Further, the buffer memory device 2220 may temporarily store data which are read from the nonvolatile memory devices 2231 to 223n. The data temporarily stored in the buffer memory device 2220 may be transmitted to the host device 2100 or the nonvolatile memory devices 2231 to 223n under the control of the SSD controller 2210.

The nonvolatile memory devices 2231 to 223n may be used as storage media of the SSD 2200. The nonvolatile memory devices 2231 to 223n may be coupled with the SSD controller 2210 through a plurality of channels CH1 to CHn, respectively. One or more nonvolatile memory devices may be coupled to one channel. The nonvolatile memory devices coupled to one channel may be coupled to the same signal bus and data bus.

The power supply 2240 may provide power PWR inputted through the power connector 2260 to the various components of the SSD 2200. The power supply 2240 may include an auxiliary power supply 2241. The auxiliary power supply 2241 may supply power so as to allow the SSD 2200 to be normally terminated when a sudden poweroff occurs. The auxiliary power supply 2241 may include large capacitance capacitors capable of being charged with power PWR.

The SSD controller 2210 may exchange a signal SGL with the host device 2100 through the signal connector 2250. The signal SGL may include a command, an address, data, and the like. The signal connector 2250 may be configured by a connector such as of parallel advanced technology attachment (PATH), serial advanced technology attachment (SATA), small computer system interface (SCSI), serial attached SCSI (SAS), peripheral component interconnection (PCI), PCI express (PCI-E) protocols and the like, according to the interface scheme between the host device 2100 and the SSD 2200.

Figure 14:
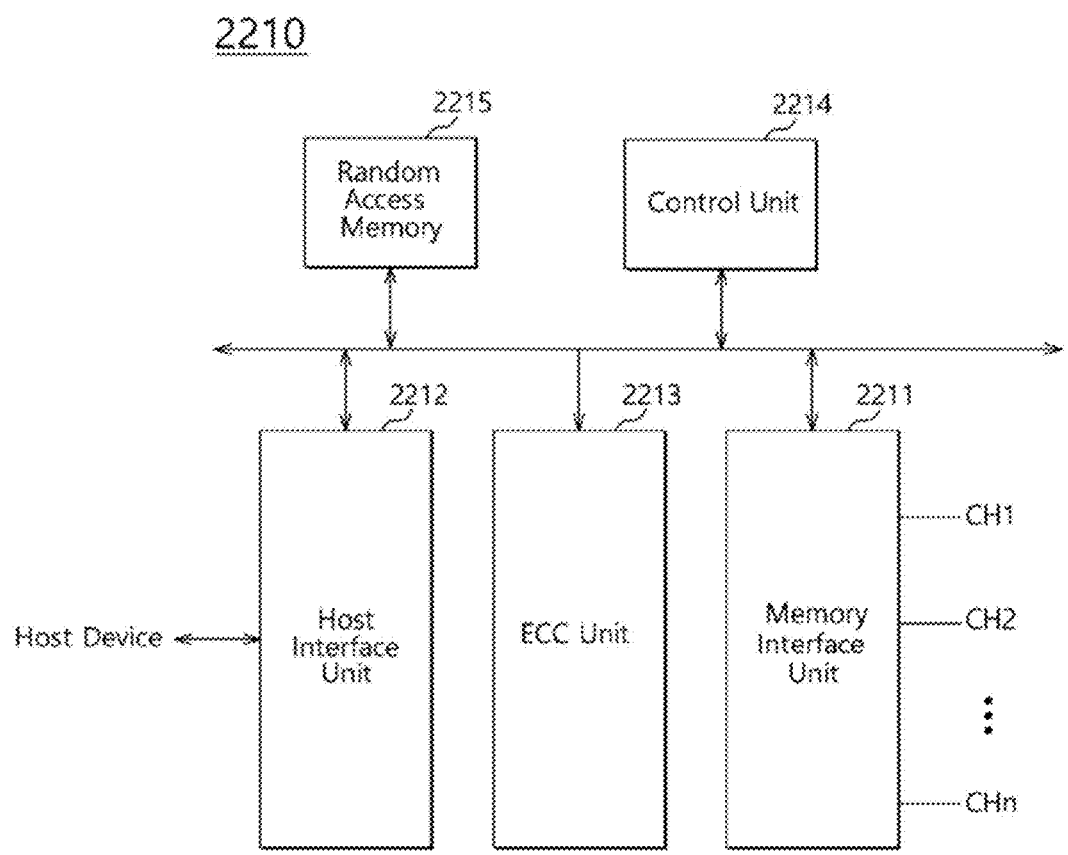
FIG. 14 is a block diagram illustrating an example configuration for the SSD controller of FIG. 13.

FIG. 14 is a block diagram illustrating an example of the SSD controller shown in FIG. 13. Referring to FIG. 14, the SSD controller 2210 may include a memory interface unit 2211, a host interface unit 2212, an error correction code (ECC) unit 2213, a control unit 2214, and a random access memory 2215.

The memory interface unit 2211 may provide a control signal, such as a command and an address to the nonvolatile memory devices 2231 to 223n. Moreover, the memory interface unit 2211 may exchange data with the nonvolatile memory devices 2231 to 223n. The memory interface unit 2211 may branch the data transmitted from the buffer memory device 2220 to the respective channels CH1 to CHn, under the control of the control unit 2214. Furthermore, the memory interface unit 2211 may transmit the data read from the nonvolatile memory devices 2231 to 223n to the buffer memory device 2220, under the control of the control unit 2214.

The host interface unit 2212 may provide an interface with the SSD 2200 in correspondence to the protocol of the host device 2100. For example, the host interface unit 2212 may communicate with the host device 2100 through one of parallel advanced technology attachment (PATA), serial advanced technology attachment (SATA), small computer system interface (SCSI), serial attached SCSI (SAS), peripheral component interconnection (PCI) and PCI express (PCI-E) protocols. In addition, the host interface unit 2212 may perform a disk emulating function of supporting the host device 2100 to recognize the SSD 2200 as a hard disk drive (HDD).

The control unit 2214 may analyze and process the signal SGL inputted from the host device 2100. The control unit 2214 may control the operations of the buffer memory device 2220 and the nonvolatile memory devices 2231 to 223n according to a firmware or a software for driving the SSD 2200. The random access memory 2215 may be used as a working memory for driving the firmware or the software.

The error correction code (ECC) unit 2213 may generate parity data to be transmitted to the nonvolatile memory devices 2231 to 223n, among data stored in the buffer memory device 2220. The generated parity data may be stored along with data in the nonvolatile memory devices 2231 to 223n. The error correction code (ECC) unit 2213 may detect an error of the data read out from the nonvolatile memory devices 2231 to 223n. When the detected error is within a correctable range, the error correction code (ECC) unit 2213 may correct the detected error.

Although not shown, the error correction code (FCC) unit 2213 may include a first decoder group and a second decoder group. The error correction code (ECC) unit 2213 may control in real time or dynamically operations of the first decoder group and the second decoder group so that minimum power (or optimal) power may be consumed while satisfying a target throughput as described above.

Figure 15:
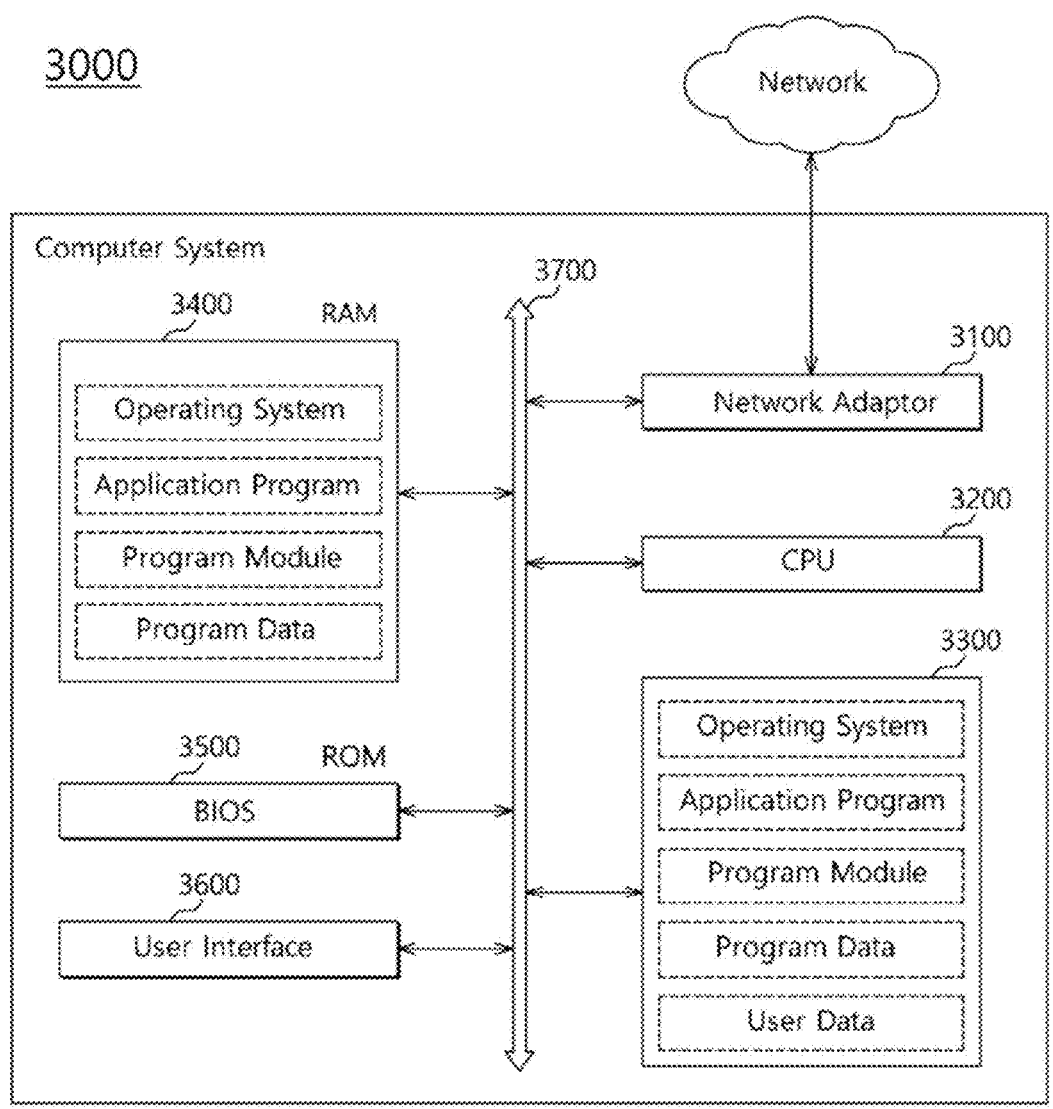
FIG. 15 is a block diagram illustrating a computer system including a data storage device, according to an embodiment of the invention.

FIG. 15 is a block diagram illustrating an example of a computer system included a data storage device according to an embodiment of the invention. Referring to FIG. 15, a computer system 3000 may include a network adaptor 3100, a central processing unit 3200, a data storage device 3300, a RAM 3400, a ROM 3500 and a user interface 3600, which are electrically coupled to a system bus 3700. The data storage device 3300 may be constructed by the data storage device 100 shown in FIG. 1, the data storage device 1200 shown in FIG. 12 or the SSD 2200 shown in FIG. 13.

The network adaptor 3100 may provide interfacing between the computer system 3000 and external networks. The central processing unit 3200 performs general operations for driving an operating system residing at the RAM 3400 or an application program.

The data storage device 3300 may store general data necessary in the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data necessary for driving programs, which are read from the data storage device 3300, may be loaded on the RAM 3400. A BIOS (basic input/output system) which is activated before the operating system is driven may be stored in the ROM 3500. Information exchange between the computer system 3000 and a user may be implemented through the user interface 3600.

Figure 16:
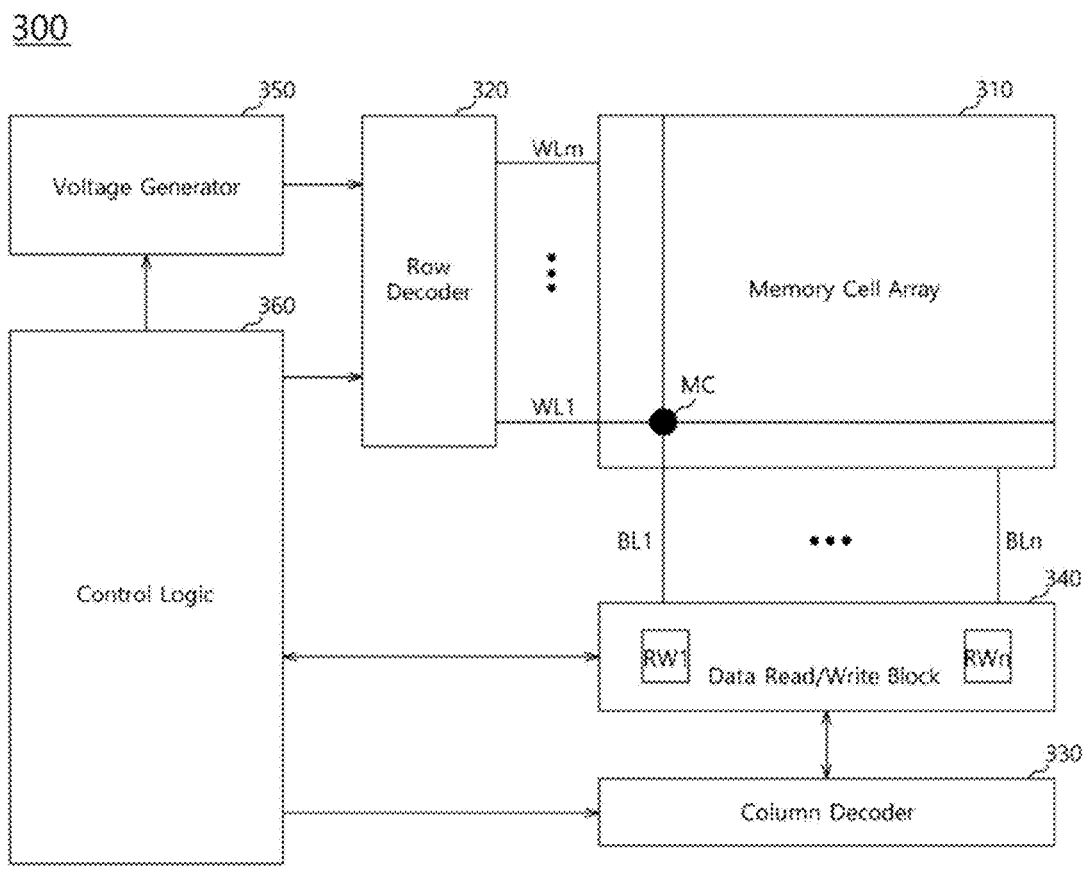
FIG. 16 is a block diagram illustrating an example of nonvolatile memory device that may be included in a data storage device, according to an embodiment of the invention.

FIG. 16 is a block diagram illustrating an example of a nonvolatile memory device that may be included in a data storage device, according to an embodiment of the invention. Referring to FIG. 16, a nonvolatile memory device 300 may include a memory cell array 310, a row decoder 320, a column decoder 330, a data read/write block 340, a voltage generator 350, and a control logic 360.

The memory cell array 310 may include memory cells MC which are arranged at areas where word lines WL1 to WLm and bit lines BL1 to BLn intersect with each other. The memory cells may be grouped by an access unit, such as a memory block as an erase unit and a page as a program and read unit.

The row decoder 320 may be coupled with the memory cell array 310 through the word lines WL1 to WLm. The row decoder 320 may operate according to the control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 360, to the word lines WL1 to WLm.

The data read/write block 340 may be coupled with the memory cell array 310 through the bit lines BL1 to BLn. The data read/write block 340 may include read/write circuits RW1 to RWn respectively corresponding to the bit lines BL1 to BLn. The data read/write block 340 may operate according to the control of the control logic 360. The data read/write block 340 may operate as a write driver or a sense amplifier according to an operation mode. For example, the data read/write block 340 may operate as a write driver which stores data provided from the external device, in the memory cell array 310 in a write operation. For another example, the data read/write block 340 may operate as a sense amplifier which reads out data from the memory cell array 310 in a read operation.

The column decoder 330 may operate according to the control of the control logic 360. The column decoder 330 may decode an address provided from the external device. The column decoder 330 may couple the read/write circuits RW1 to RWn of the data read/write block 340 respectively corresponding to the bit lines BL1 to BLn with data input/output lines (or data input/output buffers), based on a decoding result.

The voltage generator 360 may generate voltages to be used in internal operations of the nonvolatile memory device 300. The voltages generated by the voltage generator 360 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 350 may control operations of the nonvolatile memory device 300 such as read, write and erase operations of the nonvolatile memory device 300.

While various embodiments have been described above, it will be understood to those skilled in the art that the embodiments described are examples only. Accordingly, the present invention should not be limited to the described embodiments. Many other embodiments and or variations thereof may be envisaged by the skilled person in the relevant art without departing from the spirit and or scope of the present invention as defined in the following claims.

What is claimed is:

1. A data storage device comprising:
   a nonvolatile memory device; and
   an error correction code (ECC) unit including a first decoder group having first type decoders that perform first decoding operations for data read out from the nonvolatile memory device, a second decoder group having second type decoders that perform second decoding operations for the data, and a decoding control block controlling the first decoder group and the second decoder group,
   wherein the decoding control block includes a lookup table including a state information of a memory region of the nonvolatile memory device in which the read-out data is stored, a characteristic information of the first type decoders and a characteristic information of the second type decoders, and
   wherein the decoding control block calculates first power consumption amounts of the first decoder group and second power consumption amounts of the second decoder group based on the lookup table, obtains total power consumption amounts by summing the first power consumption amounts and the second power consumption amounts, generates a first decoding control information including a decoding iteration count and a clock of a first type decoder and a second decoding control information including a decoding iteration count and a clock of a second type decoder corresponding to a minimum value among the total power consumption amounts, and provides the first decoding control information and the second decoding control information to the first decoder group and the second decoder group, respectively.

2. The data storage device according to claim 1, wherein the state information of the memory region of the nonvolatile memory device in which the read-out data is stored includes an information on a program/erase count and an elapsed time after program.

3. The data storage device according to claim 2,
   wherein the characteristic information of the first type decoders includes decoding fail rates respectively corresponding to iteration counts of a decoding operation of any one of the first type decoders, and
   wherein the characteristic information of the second type decoders includes iteration counts when a decoding operation of any one of the second type decoders is a saturated state.

4. The data storage device according to claim 3, wherein the decoding control block calculates the power consumption amounts of the first decoder group and the power consumption amounts of the second decoder group for the respective decoding fail rates.

5. The data storage device according to claim 3, wherein the decoding control block calculates first throughputs based on a target throughput of the error correction code unit and the decoding fail rates, calculates first clocks based on the target throughput, iteration counts corresponding to the decoding fail rates and a unit processing amount of the respective first type decoders, and calculates the power consumption amounts of the first type decoders which operate by the first clocks.

6. The data storage device according to claim 5, wherein the decoding control block calculates second throughputs based on the target throughput and the first throughputs, calculates second clocks based on the second throughputs, an iteration count of the saturation state and a unit processing amount of the respective second type decoders, and calculates the power consumption amounts of the second type decoders which operate by the second clocks.

7. The data storage device according to claim 3, wherein the first decoder group and the second decoder group transmit results of the first and second decoding operations to the decoding control block.

8. The data storage device according to claim 7, wherein the decoding control block corrects the decoding fail rates based on the result of the first decoding operation of the first decoder group, and
   wherein the decoding control block fixes the iteration count of the saturation state when correcting the decoding fail rates.

9. The data storage device according to claim 8, wherein the decoding control block fixes the iteration count of the saturation state when correcting the decoding fail rates.

10. The data storage device according to claim 7, wherein each of the results of the first and second decoding operations include a decoding pass/fail information indicating whether the decoding operations have succeeded or failed, an iterative performance count information indicating counts by which decoding operations are iterated, and an error count information indicating counts of errors included in decoded data.

11. The data storage device according to claim 1, wherein the decoding control block provides the first decoding control information to at least one of the first type decoders of the first decoder group, and provides the second decoding control information to at least one of the second type decoders of the second decoder group.

12. The data storage device according to claim 1, wherein the second type decoders included in the second decoder group have greater error correction capability than the first type decoders of the first decoder group.

13. The data storage device according to claim 1, wherein the second type decoders included in the second decoder group have larger power consumption than the first type decoders included in the first decoder group.

14. A method for operating a data storage device including a nonvolatile memory device and an ECC unit having a first type decoder, a second type decoder and a decoding control block controlling the first and second type decoders, comprising:
   defining by the decoding control block a first decoding fail rate corresponding to a first iteration count of the first type decoder, a second decoding fail rate corresponding to a second iteration count of the first type decoder, and an iteration count of a saturation state in which performance of the second type decoder is a maximum;
   calculating by the decoding control block a first total power consumption amount by summing a first power consumption amount consumed to retain a first throughput of the first type decoder calculated based on a target throughput and the first decoding fail rate, and a second power consumption amount consumed to retain a first throughput of the second type decoder as a difference between the target throughput and the first throughput of the first type decoder;
   calculating by the decoding control block a second total power consumption amount by summing a third power consumption amount consumed to retain a second throughput of the first type decoder calculated based on the target throughput and the second decoding fail rate, and a fourth power consumption amount consumed to retain a second throughput of the second type decoder as a difference between the target throughput and the second throughput of the first type decoder; and
   providing by the decoding control block the first iteration count corresponding to the first total power consumption amount and the iteration count corresponding to the saturation state to the first type decoder and the second type decoder, respectively when the first total power consumption amount is smaller than the second total power consumption amount.

15. The method according to claim 14, wherein the calculating of the first power consumption amount comprises:
   calculating by the decoding control block a first clock based on the target throughput, the first iteration count and a unit processing amount of the first type decoder; and
   calculating by the decoding control block the first power consumption amount of the first type decoder which operates by the first clock,
   wherein the first clock is additionally provided to the first type decoder by the decoding control block.

16. The method according to claim 15, wherein the calculating of the second power consumption amount comprises:
   calculating by the decoding control block a second clock based on the first throughput of the second type decoder, the iteration count of the saturation state and a unit processing amount of the second type decoder; and
   calculating by the decoding control block the second power consumption amount of the second type decoder which operates by the second clock.

17. The method according to claim 16, wherein the second clock is additionally provided to the second type decoder by the decoding control block.

18. The method according to claim 15, wherein the second iteration count corresponding to the second total power consumption amount is provided to the first type decoder by the decoding control block, and the iteration count corresponding to the saturation state is provided to the second type decoder by the decoding control block, when the second total power consumption amount is smaller than the first total power consumption amount.

19. The method according to claim 18, wherein the calculating of the third power consumption amount comprises:
   calculating by the decoding control block a third clock based on the target throughput, the second iteration count and the unit processing amount of the first type decoder; and
   calculating by the decoding control block the third power consumption amount of the first type decoder which operates by the third clock,
   wherein the third clock is additionally provided to the first type decoder by the decoding control block.

20. The method according to claim 18, wherein the calculating of the fourth power consumption amount comprises:
   calculating by the decoding control block a fourth clock based on the second throughput of the second type decoder, the iteration count of the saturation state and the unit processing amount of the second type decoder; and
   calculating by the decoding control block the fourth power consumption amount of the second type decoder which operates by the fourth clock,
   wherein the fourth clock is additionally provided to the second type decoder by the decoding control block.

* * * * *